US009178159B2

(12) United States Patent
Pan et al.

(10) Patent No.: US 9,178,159 B2
(45) Date of Patent: Nov. 3, 2015

(54) COPOLYMERS WITH FUNCTIONALIZED SIDE CHAINS

(75) Inventors: Junyou Pan, Frankfurt am Main (DE); Niels Schulte, Kelkheim (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 14/234,720

(22) PCT Filed: Jun. 28, 2012

(86) PCT No.: PCT/EP2012/002714
§ 371 (c)(1),
(2), (4) Date: Jan. 24, 2014

(87) PCT Pub. No.: WO2013/013754
PCT Pub. Date: Jan. 31, 2013

(65) Prior Publication Data
US 2014/0175420 A1 Jun. 26, 2014

(30) Foreign Application Priority Data

Jul. 25, 2011 (EP) .................................... 11006098

(51) Int. Cl.
*H01L 29/08* (2006.01)
*H01L 51/00* (2006.01)
*H01L 51/50* (2006.01)

(52) U.S. Cl.
CPC ........ *H01L 51/0043* (2013.01); *H01L 51/0039* (2013.01); *H01L 51/5012* (2013.01); *Y02E 10/549* (2013.01)

(58) Field of Classification Search
None
See application file for complete search history.

(56) References Cited

U.S. PATENT DOCUMENTS

| 6,963,005 | B2 | 11/2005 | Lecloux et al. |
| 7,683,183 | B2 | 3/2010 | Peters et al. |
| 8,569,743 | B2* | 10/2013 | Birnstock et al. ............... 257/40 |
| 2002/0048689 | A1 | 4/2002 | Igarashi et al. |
| 2005/0244672 | A1 | 11/2005 | Che et al. |
| 2007/0111026 | A1 | 5/2007 | Deaton et al. |
| 2007/0265473 | A1 | 11/2007 | Becker et al. |
| 2008/0036370 | A1 | 2/2008 | Noh et al. |
| 2010/0026174 | A1 | 2/2010 | Igarashi et al. |
| 2010/0227974 | A1 | 9/2010 | Schulte et al. |
| 2011/0108769 | A1 | 5/2011 | Yersin et al. |

(Continued)

FOREIGN PATENT DOCUMENTS

| CN | 101747375 A | 6/2010 |
| DE | 102008033563 A1 | 1/2010 |
| EP | 1424350 | 6/2004 |

(Continued)

OTHER PUBLICATIONS

Cheng, Yi-Ming, et al., "Rational Design of Chelating Phosphine Functionalized $Os^{(II)}$ Emitters and Fabrication of Orange Polymer Light-Emitting Diodes Using Solution Process", Adv. Funct. Mater., vol. 18, (2008), pp. 83-194.

Deaton, Joseph C., et al., "E-Type Delayed Fluorescence of a Phosphine-Supported $Cu_2(\mu\text{-}NAr_2)_2$ Diamond Core: Harvesting Singlet and Triplet Excitons in OLEDsII", J. Am. Chem. Soc., vol. 132, (2010), pp. 9499-9508.

(Continued)

*Primary Examiner* — Kyoung Lee
(74) *Attorney, Agent, or Firm* — Drinker Biddle & Reath LLP

(57) ABSTRACT

The present invention relates, inter alia, to copolymers, preferably conjugated polymers, formulations comprising the copolymers and electronic devices comprising the copolymers.

21 Claims, 4 Drawing Sheets

(56) References Cited

U.S. PATENT DOCUMENTS

| | | |
|---|---|---|
| 2011/0144366 A1 | 6/2011 | Stoessel et al. |
| 2011/0155954 A1 | 6/2011 | Yersin et al. |

FOREIGN PATENT DOCUMENTS

| | | |
|---|---|---|
| JP | 2003212886 A | 7/2003 |
| WO | WO-2004/041901 | 5/2004 |
| WO | WO-2005/118606 A1 | 12/2005 |
| WO | WO-2008/019744 A1 | 2/2008 |
| WO | WO-2010006681 A1 | 1/2010 |
| WO | WO-2011063083 A1 | 5/2011 |

OTHER PUBLICATIONS

Kui, Steven C.F., et al., "Platinum(II) Complexes with □-Conjugated, Naphthyl-Substituted, Cyclometalated Ligands (RC□N□N): Structures and Photo- and Electroluminescence", Chem. Eur. J., vol. 13, (2007), pp. 417-435.

Miller, Alexander J.M., et al., "Long-Lived and Efficient Emission from Mononuclear Amidophosphine Complexes of Copper", Inorganic Chemistry, vol. 46, No. 18, (2007), pp. 7244-7246.

Moudam, Omar, et al., "Electrophosphorescent Homo- and Heteroleptic Copper(I) Complexes Prepared from Various Bis-Phosphine Ligands", Chem. Commun., (2007), pp. 3077-3079.

International Search Report for PCT/EP2012/002714 mailed Sep. 24, 2012.

U.S. Appl. No. 14/234,825, filed Jan. 24, 2014, Pan et al.

\* cited by examiner

COPOLYMERS WITH FUNCTIONALIZED SIDE CHAINS

CROSS-REFERENCE TO RELATED APPLICATIONS

This application is a national stage application (under 35 U.S.C. §371) of PCT/EP2012/002714, filed Jun. 28, 2012, which claims benefit of European application 11006098.5, filed Jul. 25, 2011.

The invention relates to an electroluminescent copolymer, an emulsion, a dispersion, and a solution comprising said copolymer, a method for the preparation of a film using the solution and/or the dispersion and/or the emulsion as well as a use of said copolymers in electronic devices, and electronic devices comprising the said copolymers.

Organic light emitting diodes (OLEDs) based on organic polymer materials, also known as polymer light emitting diodes (PLEDs), have drawn much attention due to their potential application in next generation panel displays.

Though huge improvement has been achieved in the last decades, the performance of the PLEDs, especially with respect to lifetime (particularly for blue PLEDs), still needs further improvement in order to be commercially successful. Single layer PLEDs, where the hole transport, electron transport and emissive layer are combined into one layer, have the advantage of simple processing. However, they do often show poor lifetime. WO 2004/084260 A2 discloses a PLED wherein an interlayer between the hole injection layer (HIL) and the light emitting polymer (LEP) is reported to improve the lifetime as compared to a conventional single layer PLED.

PLEDs with an interlayer have been become a standard device structure in the art. An "interlayer" as referred to hereinafter means a layer in an OLED device that is positioned either between the hole injection layer (HIL) or buffer layer and the emissive layer (EML), or between the electron injection layer (EIL) and the EML, and is intended to prevent electrons flowing from EML into the HIL, or holes flowing from EML into the EIL, respectively. An interlayer for use between the HIL and the EML should usually comprise a material having hole transport and electron blocking property, and an interlayer for use between the EIL and the EML should comprise a material having electron transport and hole blocking property.

However, the additional interlayer is undesired in mass production. Also, its processing is not easy and well controllable. The interlayer is usually coated on HIL or buffer layer (for example PEDOT:PSS), and heat-treated at a desired temperature to form a very thin insoluble layer on PEDOT. The emissive polymer (LEP) is then directly coated on interlayer, and the insoluble part of interlayer remains on PEDOT. The thickness of residual interlayer is not well-controlled. Therefore, the reliability of the performance of a PLED comprising such an interlayer is not sufficient for mass production and commercialisation.

It is therefore one aim of the present invention to find single layer PLEDs having a lifetime of the interlayer system that is comparable or even better than that of prior art PLEDs. Another aim of the present invention is to provide new materials for use in single layer PLEDs, which have advantageous properties, in particular good processability and long lifetime. Another aim of the present invention is to extend the available pool of PLED emissive polymers.

Conventionally, polymer blend is an alternative way to overcome the problems with interlayer. WO 2005/053052 A1 discloses a polymer blend comprising a first and a second polymer with triarylamine units, wherein both polymers have hole transport properties. Morteani et al., Adv. Mater. 2003, 15(20), 1708 and WO 02/28983 A1 disclose a polymer blend comprising a polymer with fluorene units and benzothiadiazole units and a polymer with fluorene units and triarylamine units, and its use in PLEDs. The polymer blends described in these references are suggested to have a band gap offset smaller than the exciton binding energy, so that the exciton can be stabilised at the blend interface, thus realizing a barrier-free heterojunction, and thus a high efficient green PLED using these blends. One drawback in conjunction with polymer blends, however, is phase separation which can occur between different polymers leading to unreliability regarding device preparation.

WO 2008/011953 discloses non-interlayer PLED, wherein the emissive layer comprises a blend of emissive polymer and a hole transporting polymer. The HOMOs of both polymers are so offset (greater than or equal to 0.2 eV, or better greater than or equal to 0.3 eV or even more) that the hole transport is only through the hole transporting polymer under electrical field, and the emissive polymer keeps in a quasi electron-only state.

However, one component materials are strongly desired in mass production in order to avoid the problems pertain to the multi-component systems, for example phase separation.

It is an object of the invention to overcome the problems known in the prior art.

The object of the invention was achieved by the electroluminescent with a conjugated backbone, comprising:
  (a) at least one hole transport unit on one or more side-chain(s) of the copolymer;
  (b) at least one electron transport unit;
  (c) at least one unit A;
  (d) optionally at least one emitter unit
wherein the HOMOs of both hole transport unit(s) and unit(s) A are at least 0.3 eV higher than the HOMO of the electron transport unit(s),
preferably the HOMO of the hole transport unit(s) is higher than 0.3 eV and the HOMO of the unit(s) A is higher than 0.4 eV than the HOMO of the electron transport unit(s)
and particularly preferably the HOMOs of both hole transport unit(s) and unit(s) A are at least 0.4 eV higher than the HOMO of the electron transport unit(s).

The formulation, particularly solution, dispersion and emulsion comprising a copolymer according to the invention, and at least one solvent. The electronic device comprising a copolymer according to the invention, preferably selected from organic light emitting diodes (OLED), polymer light emitting diodes (PLED), organic light emitting transistors (OLET), organic light emitting electrochemical cells (OLEC), organic light emitting electrochemical transistors (OLEETs), organic field effect transistors (OFET), thin film transistors (TFT), organic solar cells (O-SC), organic laser diodes (O-laser), organic integrated circuits (O-IC), radio frequency identification (RFID) tags, photodetector, sensors, logic circuits, memory elements, capacitor, charge injection layers, Schottky diodes, planarising layers, antistatic films, conducting substrates or patterns, photoconductors, electrophotographic elements, organic solar concentrator, organic spintronic devices, and an organic plasmon emitting devices (OPEDs), particularly preferably the device is an PLED, OLED or OLEC. The electronic device can be characterized in that the device comprises a conductive polymer layer and/ or a hole transporting layer, and wherein the copolymer according to the invention is coated directly onto said conductive polymer and/or hole transport layer.

Figure 1:
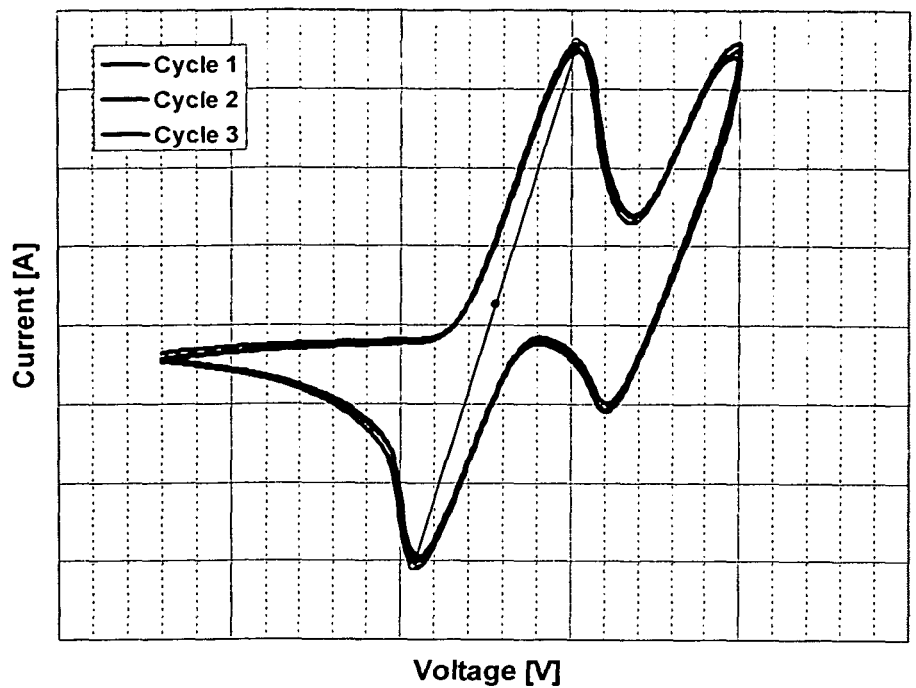
FIG. 1: I-V (current-voltage) diagram as measured with cyclic voltammetry (CV) for polymer IL1.

Further advantages or advantageous refinements of the invention will become apparent from the dependent claims and the following description.

In a first embodiment, the present invention relates to an electroluminescent copolymer. The electroluminescent copolymer comprises at least one hole transport unit on one or more side-chain(s) of the copolymer, at least one electron transport unit, and at least one unit A, wherein the HOMO of both the hole transport unit and the unit A are at least 0.3 eV higher than the HOMO of the electron transport unit. Moreover the electroluminescent copolymer may comprise at least one emitter.

In a preferred embodiment the HOMO of the hole transport unit is lower than that of the unit A, at least lower than 0.1 eV, preferably lower than 0.2 eV, and particularly preferably lower than 0.3 eV Based on the requirements regarding frontier orbital energies (HOMO/LUMO) as outlined herein it can be expected that exciton formation is likely to occur on unit A. Therefore, unit A may also be called "exciton formation unit". The exciton formed on unit A may then either be transferred to another organic functional unit or material, such as an emitter unit or emitter, or the exciton may undergo radiative decay in order to emit light on unit A directly.

"Hole transport unit" refers to a material or unit capable of transporting holes (i.e. positive charges) injected from a hole injecting material or an anode. "Electron transporting unit" refers to a material or unit capable of transporting electrons (i.e. negative charges) injected from an electron injecting material or a cathode. "Emissive unit" refers to a material or unit which, upon receiving excitonic energy by energy transfer from other units, or by forming an exciton either electrically or optically, undergoes radiative decay to emit light.

"Electron blocking unit" refers to a material or unit which, if coated adjacent to an electron transporting layer in a multilayer structure, prevents the electron flowing through. Usually it has a higher LUMO than the electron transporting material in the adjacent electron transporting layer.

The term "unit" refers to any molecular entity within the copolymer. It can be a single repeating unit, i.e. a monomer of the copolymer. In one preferred embodiment, the copolymer of the present invention is a conjugated copolymer. The unit in this context is preferably a conjugated segment comprising at least three monomers, particularly preferably consisting of exactly three monomers, e.g. a trimer.

"Backbone group", unless stated otherwise, means the group/groups that has/have the highest content of all groups present in a polymer, preferably with a ratio greater than or equal to 20%, particularly preferably greater than or equal to 30%, very particularly preferably greater than or equal to 40%, most preferably greater than or equal to 50%. Backbone groups can also form electron transporting units, hole transporting units, units A or emissive units either alone or in combination with other groups. For example, if there are two groups whose contents are clearly higher than those of the other groups present in the polymer, or if there are only two groups present in a polymer, then both groups are considered as backbone groups. Preferably the backbone groups are hole transporting groups or electron transporting groups. In a particular preferred embodiment of the present invention, the backbone is the said at least one electron transport unit.

The term small molecule as used herein is defined as molecules being not a polymer, oligomer, dendrimer, or a blend. In particular, repeating structures are absent in small molecules. The molecular weight of small molecules is typically in the range of polymers with a low number of repeating units, oligomers or less.

The molecular weight of the small molecule is preferably below 5000 g/mol, particularly preferably below 4000 g/mol, and very particularly preferably below 3000 g/mol.

The term "polymer" includes homopolymers and copolymers, e.g. statistical, alternating or block copolymers. In addition, the term "polymer" as used hereinafter does also include dendrimers, which are typically branched macromolecular compounds consisting of a multifunctional core group onto which further branched monomers are added in a regular way giving a tree-like structure, as described for example in M. Fischer and F. Vögtle, Angew. Chem., Int. Ed. 1999, 38, 885.

The molecular weight MW of the polymers of the present invention is preferably in the range of 10000 to 2000000 g/mol, particularly preferably in the range of 100000 to 1500000 g/mol, and very particularly preferably in the range of 200000 to 1000000 g/mol. The determination of MW can be performed according to standard techniques known to the person skilled in the art by employing gel permeation chromatography (GPC) with polystyrene as internal standard, for instance.

The term "conjugated polymer" means a polymer containing in its backbone (or main chain) mainly C atoms with $sp^2$-hybridisation (or optionally also sp-hybridisation), which may also be replaced by hetero atoms. In the simplest case this is for example a backbone with alternating C—C single and double (or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom).

The term "unit" in a polymer according to the present invention means a repeating unit in a polymer, which may consist of a single monomer or may also be formed by two or more monomers. For example, an emissive unit may be formed by an emitter $A^{em}$ and two polymer backbone groups B and is then given by the formula $B-A^{em}-B$. Unless stated otherwise, the quantum chemistry simulation (as described herein) is carried out on units of this formula.

In a preferred embodiment the copolymer of the present invention is a conjugated polymer. The units are preferably of the formula —$B-A^x-B$—, wherein the groups B denote independently of one another identical or different backbone groups, preferably the same backbone group, and $A^x$ is a group selected from groups having hole transporting property ($A^h$), electron transporting property ($A^e$), unit A ($A^{ex}$), or emissive property ($A^{em}$). Thus, copolymer preferably comprises one or more hole transporting units of formula —$B-A^h-B$—, wherein $A^h$ is a group having hole transport property, one or more electron transporting units of formula —B-$A^e$-B—, wherein $A^e$ is a group having electron transport property, and one or more of formula —B-$A^{ex}$-B—, wherein $A^{ex}$ is a unit A. Furthermore, the copolymer preferably comprises one or more emissive units of formula —B-$A^{em}$-B—, wherein $A^{em}$ is a group having emissive property.

However, it is also possible that the copolymer comprises one or more units formed by single groups B, $A^h$, $A^e$, $A^{ex}$, $A^{em}$, which are not present in form of triads B-$A^x$-B as described above, especially for example in non-conjugated copolymers.

Some important energy levels will be explained hereinafter. For conjugated polymers, important characteristics are the binding energies, which are measured with respect to the vacuum level of the electronic energy levels, especially the "highest occupied molecular orbital" (HOMO), and "lowest unoccupied molecular orbital" (LUMO) levels. These can be measured by photoemission, e.g. XPS (X-ray photoelectron spectroscopy) and UPS (ultra-violet photoelectron spectroscopy) or by cyclic voltammetry (hereinafter referred to as CV) for oxidation and reduction. It is well understood that the absolute energy levels are dependent of the method used, and even of the evaluation method for the same method, for example the onset point and peak point on the CV curved give different values. Therefore, a reasonable comparison should be made by the same evaluation method of the same measurement method. More recently, the quantum chemistry method, for example Density Function Theory (hereinafter referred to as DFT), has also become well-established to calculate the molecular orbital, particularly the occupied molecular orbitals; and especially the HOMO levels can be well calculated by this method. Therefore, with the help of DFT, given by commercially available software like for example "Gaussian 03W" (Gaussian, Inc.), the HOMO/LUMO of the different units in the conjugated copolymers can be calculated.

Thus, within this application levels of molecular orbitals (i.e., HOMO and/or LUMO) refers to the Density Function Theory and CV as described below, particularly in the Working Examples.

The energy gap or band gap of a unit is defined by the gap between HOMO and LUMO levels. For determining energy gaps or band gaps, the HOMO and LUMO levels of the unit of interest should be measured or calculated with the same method. The methods used according to the invention are calibrated DFT method and CV measurement.

It should also be pointed out that the HOMO of the entire conjugated copolymer is determined by the highest HOMO of its different units, and the LUMO of the entire conjugated copolymer is determined by the lowest LUMO of its different units. In a preferred embodiment of the present invention, the HOMO of the copolymer can be determined by the HOMO of its unit A, and the LUMO of the copolymer can be determined by the LUMO of its electron transport unit.

Unless stated otherwise, groups or indices like $Ar^1$, $R^1$, a etc. in case of multiple occurrence are selected independently from each other and may be identical or different from each other. Thus, several different groups might be represented by a single label like "$R^1$".

The term "aryl" or "arylene" means an aromatic hydrocarbon group or a group derived from an aromatic hydrocarbon group. The term "heteroaryl" or "heteroarylene" means an "aryl" or "arylene" group comprising one or more hetero atoms. The terms "alkyl", "aryl", "heteroaryl" etc. also include multivalent species, for example alkylene, arylene, "heteroarylene" etc.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The terms "hydrocarbon group", and "hydrocarbyl group" denote a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryl, arylalkyl, alkylaryloxy, arylalkyloxy arylcarbonyl, aryloxycarbonyl, arylcarbonyloxy and aryloxycarbonyloxy, each of which is optionally substituted and has 6 to 40, preferably 6 to 25 C atoms.

The carbyl or hydrocarbyl group may be a saturated or unsaturated acyclic group, or a saturated or unsaturated cyclic group. Unsaturated acyclic or cyclic groups are preferred, especially alkenyl and alkinyl groups (especially ethinyl). Where the $C_1$-$C_{40}$ carbyl or hydrocarbyl group is acyclic, the group may be linear or branched.

The $C_1$-$C_{40}$ carbyl or hydrocarbyl group includes for example: $C_1$-$C_{40}$ alkyl, $C_2$-$C_{40}$ alkenyl, $C_2$-$C_{40}$ alkinyl, $C_3$-$C_{40}$ alkyl group, $C_4$-$C_{40}$ alkyldienyl, $C_4$-$C_{40}$ polyenyl, $C_6$-$C_{40}$ aryl, $C_6$-$C_{40}$ aryloxy, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_6$-$C_{40}$ heteroaryl, $C_4$-$C_{40}$ cycloalkyl, $C_4$-$C_{40}$ cycloalkenyl, and the like. Very preferred are $C_1$-$C_{20}$ alkyl, $C_2$-$C_{20}$ alkenyl, $C_2$-$C_{20}$ alkinyl, $C_3$-$C_{20}$ alkyl, $C_4$-$C_{20}$ alkyldienyl, $C_6$-$C_{12}$ aryl, $C_6$-$C_{20}$ arylalkyl and $C_6$-$C_{20}$ heteroaryl.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —CO—$NR^0$—, —$NR^0$—CO—, —$NR^0$—CO—$NR^{00}$—, —$CY^1$=$CY^2$— or —C≡C— in such a manner that O and/or S atoms are not linked directly to one another, wherein $Y^1$ and $Y^2$ are independently of each other H, F, Cl or CN, and $R^0$ and $R^{00}$ are independently of each other H or an optionally substituted aliphatic or aromatic hydrocarbon with 1 to 20 C atoms.

$R^0$ and $R^{00}$ are preferably selected from H, straight-chain or branched alkyl with 1 to 12 C atoms or aryl with 6 to 12 C atoms.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkinyl groups include, without limitation, ethinyl, propinyl, butinyl, pentinyl, hexinyl, octinyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthaimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenolthiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-i-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_1$ to $C_{12}$-alkyl, $C_6$ to $C_{12}$-aryl, $C_1$ to $C_{12}$-alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, solubilising groups such as alkyl or alkoxy, electron withdrawing groups such as fluorine, nitro or cyano, and substituents for increasing glass transition temperature of the polymer such as bulky groups, e.g. t.-butyl or optionally substituted aryl.

Preferred substituents include, without limitation, F, Cl, Br, I, —CN, —NO$_2$, —NCO, —NCS, —OCN, —SCN, —C(=O)NR$^O$R$^{OO}$, —C(=O)X$^O$, —C(=O)R$^O$, —NR$^O$R$^{OO}$, optionally substituted silyl, aryl or heteroaryl with 4 to 40, preferably 6 to 20 C atoms, and straight chain or branched alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, wherein R$^O$ and R$^{OO}$ are as defined above and X$^O$ is halogen.

The HOMOs of both the hole transport unit(s) and the unit(s) A are at least 0.3 eV higher than the HOMO of the electron transport unit(s). Preferably at least one or both of the hole transport unit(s) and the unit(s) A has a HOMO of 0.4 eV higher and particularly preferably at least 0.5 eV higher than the HOMO of the electron transport unit(s). These preferred embodiments may help to prevent the holes injecting onto the electron transport, unit, specifically electron transporting polymer backbone.

In another preferred embodiment the present invention relates to said copolymer, wherein either the HOMO of the hole transport unit(s) is higher than 0.3 eV and the HOMO of the unit(s) A is higher than 0.4 eV than the HOMO of the electron transport unit(s) and further preferably the HOMO of the hole transport unit(s) is higher than 0.35 eV and the HOMO of the unit(s) A is higher than 0.5 eV than the HOMO of the electron transport unit(s).

Phrases like "the energy level is higher than" refer to absolute energies to vacuum level (0.0 eV), rather than to distances from the vacuum level. Thus, a HOMO level at −5.1 eV is higher than a HOMO level at −5.3 eV, for instance.

In a preferred embodiment the HOMO of the hole transport unit is lower than that of the unit A, at least lower than 0.1 eV, preferably lower than 0.2 eV, and particularly preferably lower than 0.3 eV. This may help the holes be trapped on unit A.

In a further preferred embodiment the HOMO of unit A is higher than −5.0 eV, very preferably higher than −4.9 eV, according to the method of the present invention.

Preferably, the LUMO of unit A is higher than the LUMO of the said electron transport unit, particularly preferably 0.1 eV and very particularly preferably 0.2 eV higher than that of said electron transport unit. This may help most of electrons to transport on electron transport unit, specifically on electron transporting polymer backbone In embodiments described herein, unit A may itself an emissive unit.

The ratio of the hole transport group $A^h$ in the copolymer is from 5 to 30 mol %, preferably from 5 to 20 mol %, very preferably from 10 to 20 mol %

The ratio of the electron transport group $A^e$ in copolymer is from 10 to 95 mol %, preferably from 20 to 90 mol %, and particularly preferably from 50 to 90 mol %

The ratio of the excition formation group $A^{ex}$ in the copolymer is from 0.01 to 10 mol %, preferably from 0.01 to 8 mol %, particularly preferably from 0.05 to 4 mol %, and very particularly preferably from 0.05 to 2.5 mol %.

The copolymer of the present invention comprises at least one electron transport unit. For example in a conjugated polymer, the electron transport unit can be in form of —B-A$^e$-B—, wherein A$^e$ is a group having electron transport property.

In principle any electron transport material (ETM) known to one skilled in the art can be employed as A$^e$ in the copolymer according to the present invention. Suitable ETMs are selected from the group consisting of imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphinoxides, phenazines, phenanthrolines, triarylboranes, isomers and derivatives thereof.

Further, suitable ETMs are metal chelates of 8 hydroxyquinoline (for example Liq, Alq$_3$, Gaq$_3$, Mgq$_2$, Znq$_2$, Inq$_3$, Zrq$_4$), Balq, 4 azaphenanthrene-5-ol/Be complexes (U.S. Pat. No. 5,529,853 A; e.g. Formula (1)), butadiene derivatives (U.S. Pat. No. 4,356,429), heterocyclic optical brighteners (U.S. Pat. No. 4,539,507), benzazoles, such as, for example, 1,3,5-tris(2-N-phenylbenzimidazolyl)-benzene (TPBI) (U.S. Pat. No. 5,766,779, Formula (2)), 1,3,5-triazines, pyrenes, anthracenes, tetracenes, fluorenes, spirobifluorenes, dendrimers, tetracenes, for example rubrene derivatives, 1,10-phenanthroline derivatives (JP 2003/115387, JP 2004/311184, JP 2001/267080, WO 2002/043449), silacylcyclopentadiene derivatives (EP 1480280, EP 1478032, EP 1469533), pyridine derivatives (JP 2004/200162 Kodak), phenanthrolines, for example BCP and Bphen, also a number of phenanthrolines bonded via biphenyl or other aromatic groups (US 2007/0252517 A1) or phenanthrolines bonded to anthracene (US 2007/0122656 A1, e.g. Formulae (3) and (4)), 1,3,4-oxadiazoles, for example Formula (5), triazoles, for example Formula (6), triarylboranes, benzimidazole derivatives and other N heterocyclic compounds (cf. US 2007/0273272 A1), silacyclopentadiene derivatives, borane derivatives.

Preference is given to 2,9,10-substituted anthracenes (with 1- or 2-naphthyl and 4- or 3-biphenyl) or molecules which contain two anthracene units (US 2008/0193796 A1).

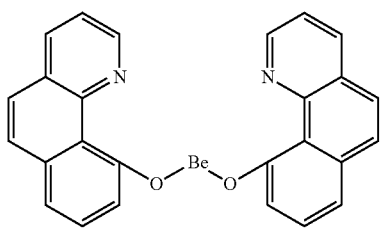

Formula (1)

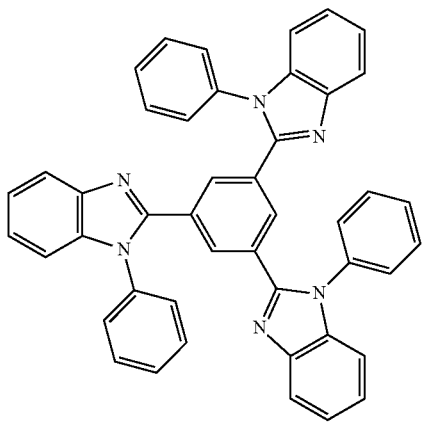

Formula (2)

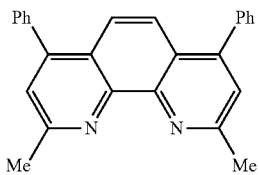

Formula (3)

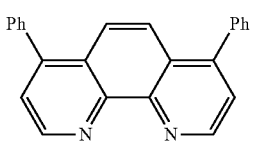

Formula (4)

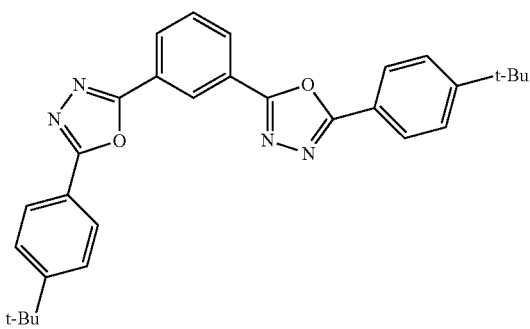

Formula (5)

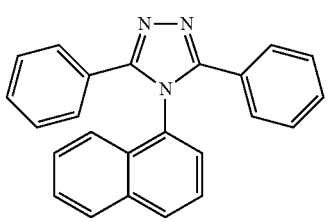

Formula (6)

Preference is likewise given to anthracene-benzimidazole derivatives, such as, for example, the compounds of Formulae (7) to (9), and as disclosed in, e.g., U.S. Pat. No. 6,878,469 B2, US 2006/147747 A, and EP 1551206 A1.

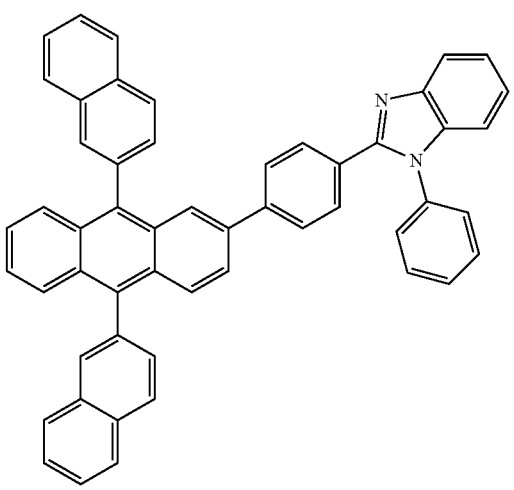

Formula (7)

Formula (8)

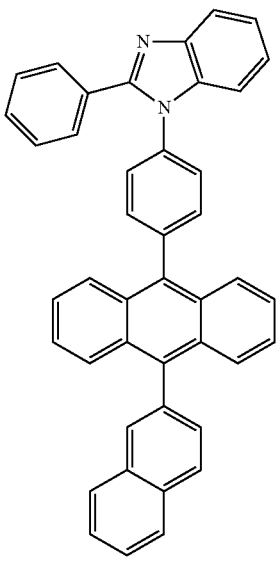

Formula (9)

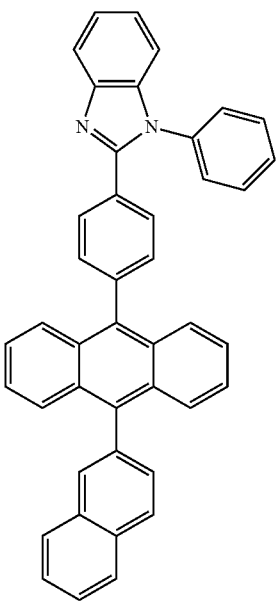

Further suitable electron transport unit in the copolymer of the present invention may comprise a group from selected from electron transport host and/or matrix materials known to one skilled in the art. Suitable host or matrix materials are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, such as, for example, phenanthrene, tetracene, coronene, chrysene, fluorene, spirofluorene, perylene, phthaloperylene, naphthaloperylene, decacyclene, rubrene, the oligoarylenevinylenes (for example DPVBi or spiro-DPVBi in accordance with EP 676461), the polypodal metal complexes (for example in accordance with WO 2004/081017), in particular metal complexes of 8 hydroxyquinoline, for example AlQ$_3$ or bis(2-methyl-8-quinolinolato)-4-(phenyl- phenolinolato) aluminium, also with imidazole chelate (US 2007/0092753 A1) and quinoline-metal complexes, aminoquinoline-metal complexes, benzoquinoline-metal complexes, the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with the unpublished application DE 102007024850.6). Particularly preferred host materials are selected from the classes of the oligoarylenes, containing naphthalene, anthracene, benzanthracene and/or pyrene, or atropisomers of these compounds, the ketones, the phosphine oxides and the sulfoxides. Very particularly preferred host materials are selected from the classes of the oligoarylenes, containing anthracene, benzanthracene and/or pyrene, or atropisomers of these compounds. For the purposes of this invention, an oligoarylene is intended to be taken to mean a compound in which at least three aryl or arylene groups are bonded to one another.

In a preferred embodiment, the copolymer of the present invention comprises at least one electron transport polymer backbone.

These are, for example, 4,5-dihydropyrene derivatives, 4,5,9,10-tetra-hydropyrene derivatives, fluorene derivatives as disclosed for example in U.S. Pat. No. 5,962,631, WO 2006/052457 A2 and WO 2006/118345A1, 9,9'-spirobifluorene derivatives as disclosed for example in WO 2003/020790 A1, 9,10-phenanthrene derivatives as disclosed, for example, in WO 2005/104264 A1, 9,10-dihydrophenanthrene derivatives as disclosed for example in WO 2005/014689 A2, 5,7-dihydrodibenzooxepine derivatives and cis- and trans-indenofluorene derivatives as disclosed for example in WO 2004041901A1, WO 2004113412 A2 and, binaphthylene derivatives as disclosed for example in WO 2006/063852 A1, and further backbone as disclosed for example in WO 2005/056633A1, EP 1344788A1 and WO 2007/043495A1, WO 2005/033174 A1, WO 2003/099901A1 and DE 102006003710.3.

Preferred backbones are those of Formula (10):

Formula (10)

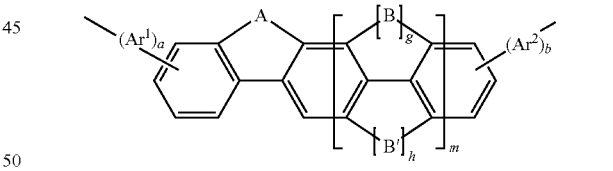

wherein

A, B and B' are independently of each other, and in case of multiple occurrence independently of one another, a divalent group, preferably selected from —CR$^1$R$^2$—, —NR$^1$—, —PR$^1$—, —O—, —S—, —SO—, —SO$_2$—, —CO—, —CS—, —CSe—, —P(=O)R$^1$—, —P(=S)R$^1$— and —SiR$^1$R$^2$—, R$^1$ and R$^2$ are independently of each other identical or different groups selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and optionally the groups R$^1$ and $R^2$ form a spiro group with the fluorene moiety to which they are attached, X is halogen, $R^0$ and $R^{00}$ are independently of each other H or an optionally substituted carbyl or hydrocarbyl group optionally comprising one or more hetero atoms, each g is independently 0 or 1 and each corresponding h in the same subunit is the other of 0 or 1, m is an integer $\geq 1$, $Ar^1$ and $Ar^2$ are independently of each other mono- or polynuclear aryl or heteroaryl that is optionally substituted and optionally fused to the 7,8-positions or 8,9-positions of the indenofluorene group, a and b are independently of each other 0 or 1.

If the groups $R^1$ and $R^2$ form a spiro group with the fluorene group to which they are attached, it is preferably spirobifluorene.

The groups of Formula (10) are preferably selected from the following Formulae (11) to (15):

Formula (11)

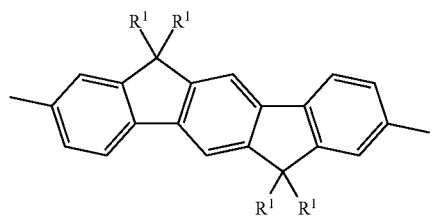

Formula (12)

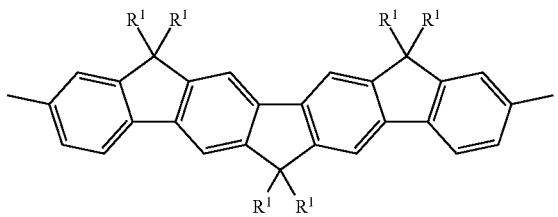

Formula (13)

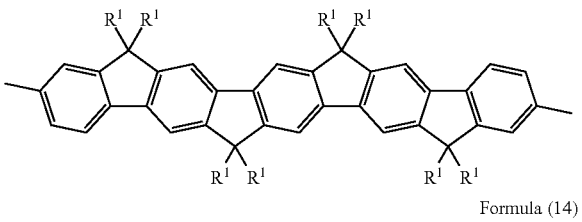

Formula (14)

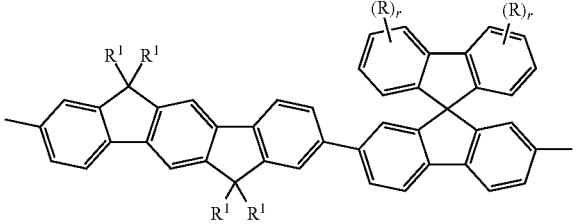

Formula (15)

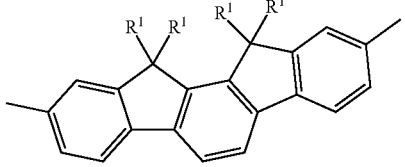

wherein $R^1$ is as defined in Formula (10), r is 0, 1, 2, 3 or 4, and R has one of the meanings of $R^1$.

R is preferably F, Cl, Br, I, —CN, —NO$_2$, —NCO, —NCS, —OCN, —SCN, —C(=O)NR$^0$R$^{00}$, —C(=O)X$^0$, —C(=O)R$^0$, —NR$^0$R$^{00}$, optionally substituted silyl, aryl or heteroaryl with 4 to 40, preferably 6 to 20 C atoms, or straight chain, branched or cyclic alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, and wherein $R^0$, $R^{00}$ and $X^0$ are as defined above.

Preferred groups of Formula (10) are selected from the following Formulae (16) to (19):

Formula (16)

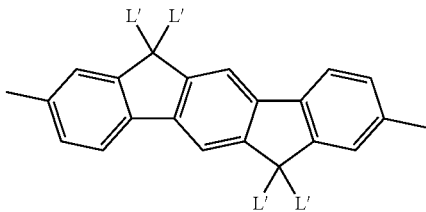

Formula (17)

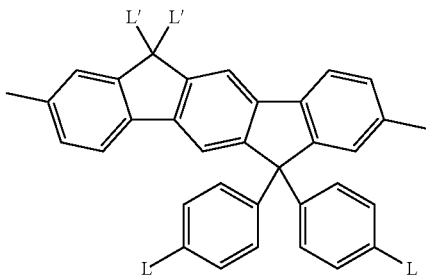

Formula (18)

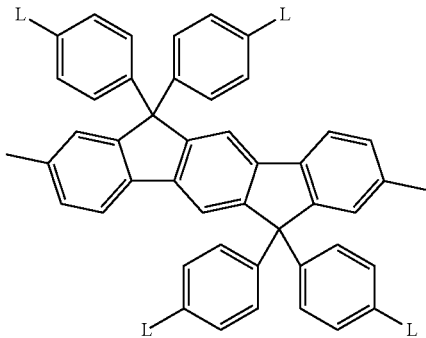

Formula (19)

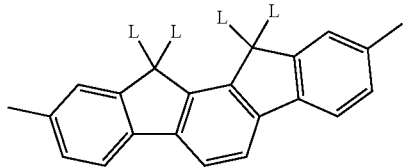

Formula (21)

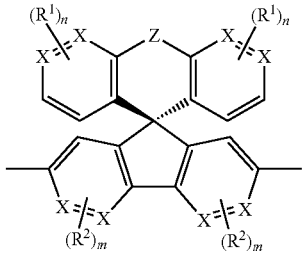

wherein

L is H, halogen or optionally fluorinated, linear or branched alkyl or alkoxy with 1 to 12 C atoms, and is preferably H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy.

Preferred electron transport backbones are those of Formula (20):

Formula (20)

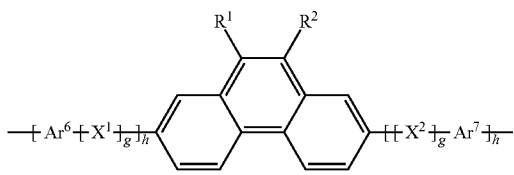

In Formula (20)

$X^1$ and $X^2$ are independently of each other —$CR^1$=$CR^1$—, —C≡C— or —N—$Ar^8$—, $R^1$ and $R^2$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally comprises one or more heteroatoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally comprising one or more heteroatoms, $Ar^6$, $Ar^7$, and $Ar^8$ are in case of multiple occurrence independently of one another a bivalent aromatic or heteroaromatic ring system having from 2 to 40 C atoms, which is optionally substituted by one or more groups $R^1$ as defined above, g is in each occurrence independently of one another 0 or 1, h is in each occurrence independently of one another 0, 1 or 2.

Suitable examples for silyl, carbyl, hydrocarbyl are those mentioned above.

In another embodiment the copolymer according to the invention comprises one or more identical or different groups of Formula (21) as electron transport unit:

In Formula (21)

X is in each occurrence independently of one another CH, $CR^1$, $CR^2$ or N, Z is in each occurrence independently of one another a single bond, $CR^5R^6$, $CR^5R^6$—$CR^5R^6$, $CR^5$=$CR^6$, O, S, N—$R^5$, C=O, C=$CR^5R^6$ or $SiR^5R^6$; $R^1$ and $R^2$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally comprises one or more heteroatoms, and optionally the groups $R^1$ and $R^2$ form a spiro group with the fluorene moiety to which they are attached, $R^5$ and $R^6$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally comprises one or more heteroatoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally comprising one or more heteroatoms, m is in each occurrence independently of one another 0, or 1, n is in each occurrence independently of one another 0, 1 or 2.

The copolymer may comprise more than two different electron transport group $A^e$. The ratio of the all electron transport group $A^e$ in copolymer is from 10 to 95 mol %, preferably from 20 to 90 mol %, and most preferably from 50 to 90 mol %

Within the meaning of the present invention "hole transport unit" is a organic group having hole transport properties. "Hole transport property" refers to a material or unit capable of transporting holes (i.e. positive charges) injected from a hole injection material or an anode. A hole transport unit has usually high HOMO, typically higher than −5.4 eV.

According to an embodiment of the invention the copolymer comprises one or more identical or different hole transport unit(s) selected from the group consisting of amines, triarylamines, thiophenes, carbazoles, phthalocyanines, porphyrines and their derivatives.

According to a further preferred embodiment of the invention the copolymer comprises one or more identical or different groups of Formula (22) as hole transport unit:

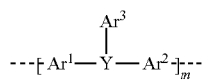

Formula (22)

In Formula (22)

Y is N, P, P=O, PF$_2$, P=S, As, As=O, As=S, Sb, Sb=O or Sb=S,

Ar$^1$, which may be the same or different, denote, independently if in different repeat units, a single bond or an optionally substituted mononuclear or polynuclear aryl group, Ar$^2$, which may be the same or different, denote, independently if in different repeat units, an optionally substituted mononuclear or polynuclear aryl group, Ar$^3$, which may be the same or different, denote, independently if in different repeat units, an optionally substituted mononuclear or polynuclear aryl group, m is 1, 2 or 3, and the dashed lines denote the coupling position of the polymerisation In a preferred embodiment Ar$^3$, which may be the same or different, denote, independently if in different repeat units, an optionally substituted mononuclear or polynuclear aryl group, which is substituted by a bridging group linking different chain residues of Formula (10).

Suitable examples for mononuclear aryl, polynuclear aryl, silyl are those mentioned above.

According to a further embodiment of the invention the copolymer comprises one or more identical or different groups of Formulae (23) to (25) as hole transport unit:

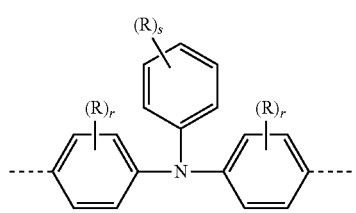

Formula (23)

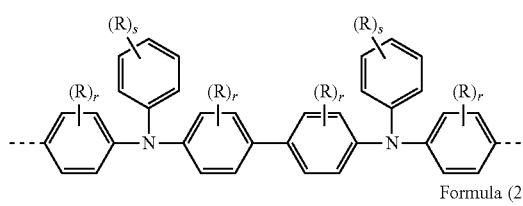

Formula (24)

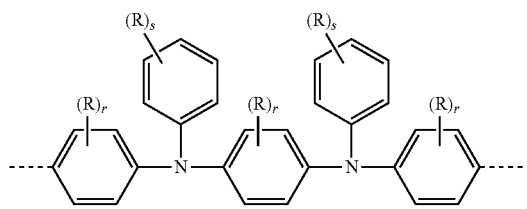

Formula (25)

In Formulae (23) to (25)

R, which may be the same or different, is selected from substituted or unsubstituted aromatic or heteroaromtic group, alkyl, cycloalkyl, alkoxy, aralkyl, aryloxy, arylthio, alkoxycarbonyl, silyl, carboxy group, a halogen atom, cyano group, nitro group or hydroxy group or a single bond bonded to the polymer backbone, r is 0, 1, 2, 3 or 4, and s is 0, 1, 2, 3, 4 or 5.

According to a further preferred embodiment of the invention the copolymer comprises one or more identical or different groups of Formula (26) as hole transport unit:

Formula (26)

wherein

T$^1$ and T$^2$ are independently of each other selected from thiophene, selenophene, thieno[2,3b]thiophene, thieno[3,2b]thiophene, dithienothiophene, pyrrole, aniline, all of which are optionally substituted with R$^5$, R$^5$ is in each occurrence independently of each other selected from halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally contains one or more hetero atoms, Ar$^4$ and Ar$^5$ are independently of each other mononuclear or polynuclear aryl or heteroaryl, which is optionally substituted and optionally fused to the 2,3-positions of one or both of the adjacent thiophene or selenophene groups, c and e are independently of each other 0, 1, 2, 3 or 4, with 1<c+e≤6, d and f are independently of each other 0, 1, 2, 3 or 4.

The repeating units of Formula (26) are preferably selected from the following Formulae (27) to (42):

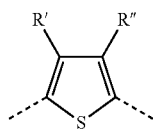

Formula (27)

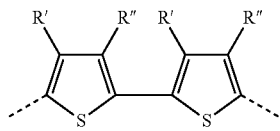

Formula (28)

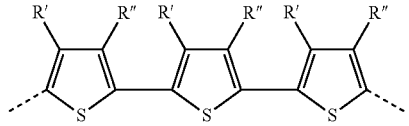

Formula (29)

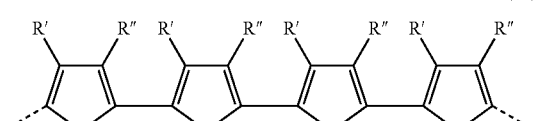

Formula (30)

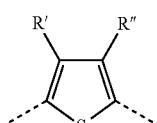

Formula (31)

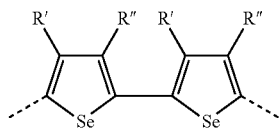

Formula (32)

-continued

Formula (33)
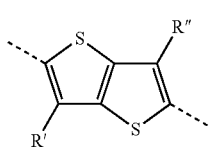

Formula (34)
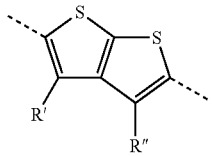

Formula (35)
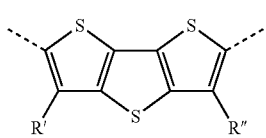

Formula (36)
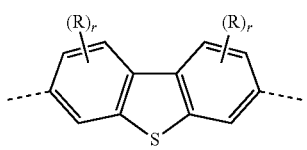

Formula (37)
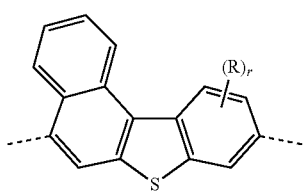

Formula (38)
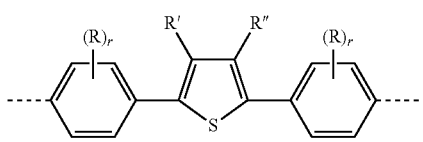

Formula (39)
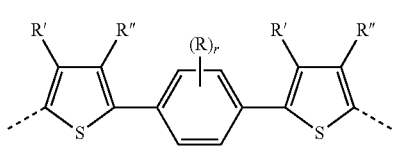

Formula (40)
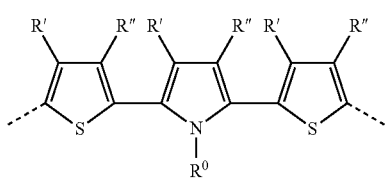

-continued

Formula (41)
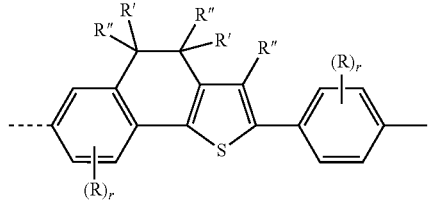

Formula (42)
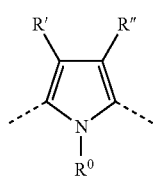

wherein R', R" and R have in case of multiple occurrence independently of one another one of the meanings of $R^1$ in Formula (26), $R^0$ is defined as in Formula (1), and r is 0, 1, 2, 3 or 4.

R' and R" in Formula (27) to (30) are preferably different from H and n-alkyl, and are preferably linear or branched alkoxy, thioalkyl or fluorinated alkyl with 1 to 22 C-atoms.

Further, in principle any hole transport material (HTM) known to one skilled in the art may be employed as $A^h$ in the copolymer according to the present invention.

Suitable HTMs are phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP A 56-46234), polycyclic aromatic compounds (EP 1009041), polyarylalkane derivatives (U.S. Pat. No. 3,615,402), fluorenone derivatives (JP A 54-110837), hydrazone derivatives (U.S. Pat. No. 3,717,462), stilbene derivatives (JP A 61-210363), silazane derivatives (U.S. Pat. No. 4,950,950), porphyrin compounds (JP A 63-2956965), aromatic dimethylidene-type compounds, carbazole compounds, such as, for example, CDBP, CBP, mCP, aromatic tertiary amine and styrylamine compounds (U.S. Pat. No. 4,127,412), and monomeric triarylamines (U.S. Pat. No. 3,180,730).

Preference is given to aromatic tertiary amines containing at least two tertiary amine units (U.S. Pat. No. 4,720,432 and U.S. Pat. No. 5,061,569), such as, for example, 4,4'-bis[N-(1-naphthyl)-N-phenylamino]biphenyl (NPD) (U.S. Pat. No. 5,061,569) or MTDATA (JP A 4-308688), N,N,N',N'-tetra(4-biphenyl)diaminobiphenylene (TBDB), 1,1-bis(4-di-p-tolylaminophenyl)cyclohexane (TAPC), 1,1-bis(4-di-p-tolylaminophenyl)-3-phenylpropane (TAPPP), 1,4-bis[2-[4-[N,N-di(p-tolyl)amino]phenyl]vinyl]benzene (BDTAPVB), N,N,N',N'-tetra-p-tolyl-4,4'-diaminobiphenyl (TTB), TPD, N,N,N',N'-tetraphenyl-4,4'''-diamino-1,1':4',1":4",1'''-quaterphenyl, likewise tertiary amines containing carbazole units, such as, for example, 4 (9H-carbazol-9-yl)-N,N-bis[4-(9H-carbazol-9-yl)phenyl]benzeneamine (TCTA). Preference is likewise given to hexaazatriphenylene compounds in accordance with US 2007/0092755 A1.

Particular preference is given to the following triarylamine compounds of the Formulae (43) to (48), which may also be substituted, and as disclosed in EP 1162193 A1, EP 650955 A1, Synth. Metals 1997, 91(1-3), 209, DE 19646119 A1, WO 2006/122630 A1, EP 1860097 A1, EP 1834945 A1, JP 08053397 A, U.S. Pat. No. 6,251,531B1, and WO 2009/041635.

Formula (43)

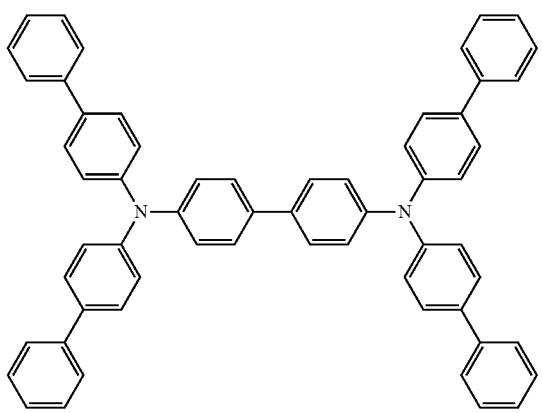

Formula (44)

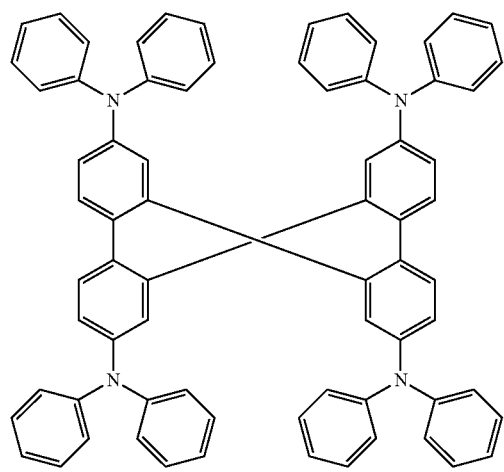

Formula (45)

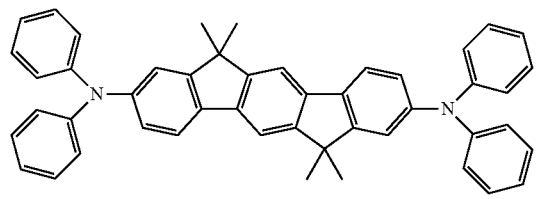

Formula (46)

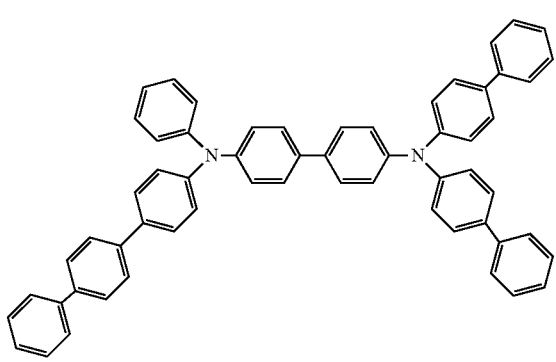

Formula (47)

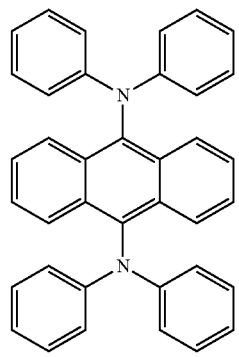

Formula (48)

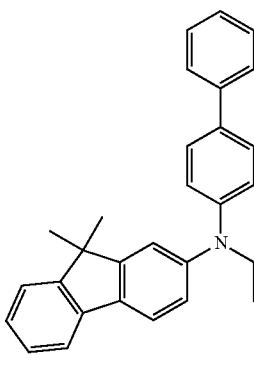

Further suitable group which can be incorporated as $A^h$ in the copolymer of the present invention may be selected from organic hole injection materials known to one skilled in the art.

Further to HIM mentioned above, suitable HIM are triazole derivatives (U.S. Pat. No. 3,112,197), oxazole derivatives (U.S. Pat. No. 3,257,203), oxadiazole derivatives (U.S. Pat. No. 3,189,447), imidazole derivatives (JP Showa 37 (=1962) 16096), imidazolones, imidazole thiones, tetrahydroimidazoles, polyarylalkane derivatives (U.S. Pat. No. 3,615,402), pyrazoline and pyrazolone derivatives (U.S. Pat. No. 3,180,729 and U.S. Pat. No. 4,278,746), phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP Showa 54 (1979) 110837), hydrazone derivatives (U.S. Pat. No. 3,717,462), acylhydrazones, stilbene derivatives (JP Showa 61 (1986) 210363), silazane derivatives (U.S. Pat. No. 4,950,950), porphyrin compounds (JP Showa 63 (1988) 2956965, U.S. Pat. No. 4,720,432), aromatic tertiary amines and styrylamines (U.S. Pat. No. 4,127,412), triphenylamines of the benzidine type, triphenylamines of the styrylamine type, and triphenylamines of the diamine type. Arylamine dendrimers can also be used (JP Heisei 8 (1996) 193191), as can phthalocyanine derivatives, naphthalocyanine derivatives, or butadiene derivatives, and quinoline derivatives, such as, for example, dipyrazino[2,3 f:2',3' h]quinoxaline hexacarbonitrile, are also suitable.

Particular preference is given to the tertiary aromatic amines (US 2008/0102311 A1), for example N,N'-diphenyl- N,N'-di(3-tolyl)benzidine (=4,4'-bis[N-3-methylphenyl]-N-phenylamino)biphenyl (NPD) (U.S. Pat. No. 5,061,569), N,N'-bis(N,N'-diphenyl-4-aminophenyl)-N,N-diphenyl-4,4'-diamino-1,1'-biphenyl (TPD 232) and 4,4',4''-tris[3-methylphenyl)phenylamino]-triphenylamine (MTDATA) (JP Heisei 4 (1992) 308688) or phthalocyanine derivatives (for example $H_2Pc$, CuPc, CoPc, NiPc, ZnPc, PdPc, FePc, MnPc, ClAlPc, ClGaPc, ClInPc, ClSnPc, $Cl_2SiPc$, (HO)AlPc, (HO)GaPc, VOPc, TiOPc, MoOPc, GaPc-O-GaPc).

Particular preference is given to the following triarylamine compounds of the Formulae (49) (TPD 232), (50), (51), and (52), which may also be substituted, and further compounds as disclosed in U.S. Pat. No. 7,399,537 B2, US 2006/0061265 A1, EP 1661888 B1, and JP 08292586A.

Further compounds suitable as hole injection material are disclosed in EP 0891121A1 and EP 1029909 A1. Hole injection layers in general are described in US 2004/0174116.

Formula (49)

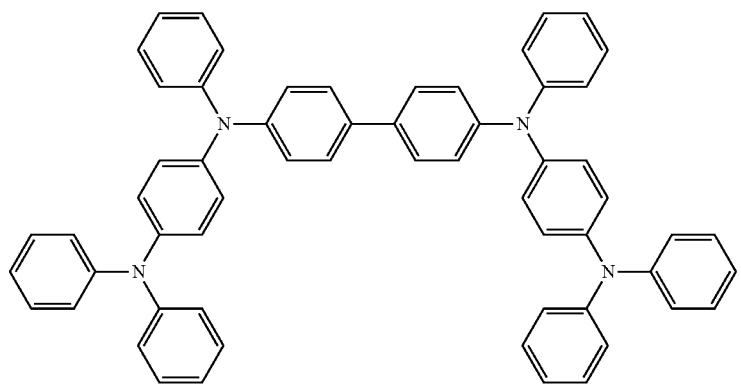

Formula (50)

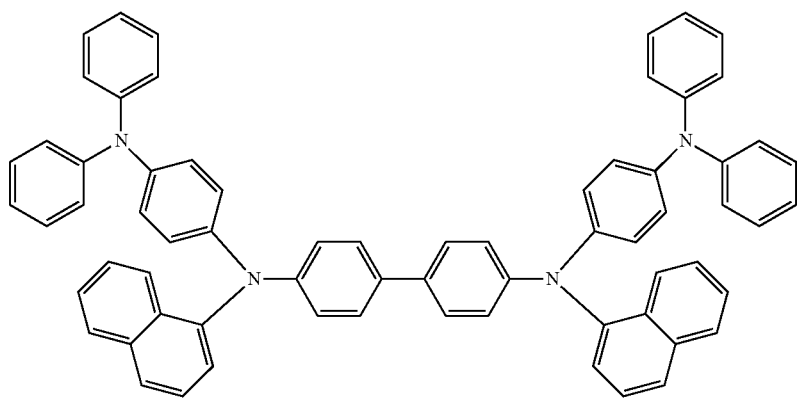

Formula (51)

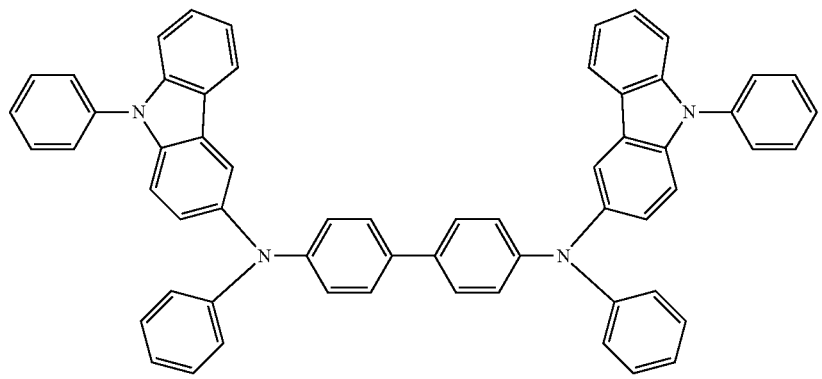

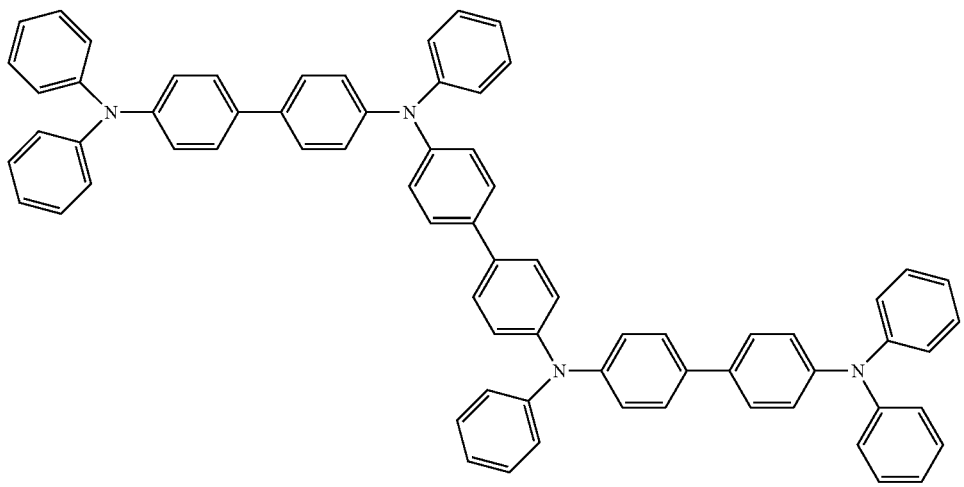
Formula (52)

The copolymer may comprise two or more than two different hole transport groups $A^h$. The ratio of all hole transport group $A^h$ in the copolymer is from 5 to 30 mol %, preferably from 5 to 20 mol % and particularly preferably from 10 to 20 mol %.

In a preferred embodiment the at least one hole transport unit on one or more side-chain(s) of the copolymer is conjugately bonded to backbone of the copolymer. That is, there is a conjugation between hole transport unit and the polymer backbone. The polymer repeating of this embodiment are for example, wherein the dash lines are the bonding direction in the polymer main chain:

Formula (53)

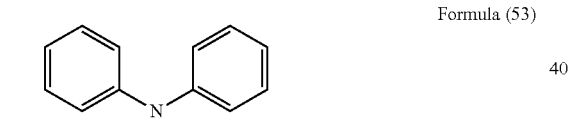

Formula (54)

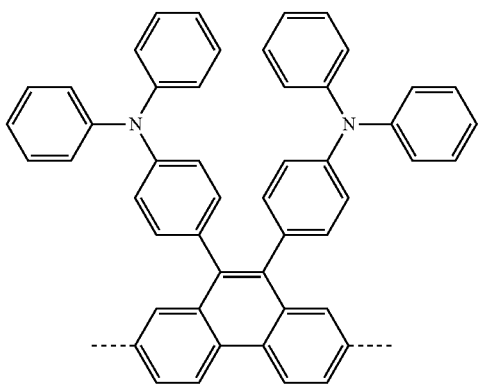
Formula (55)

Formula 56

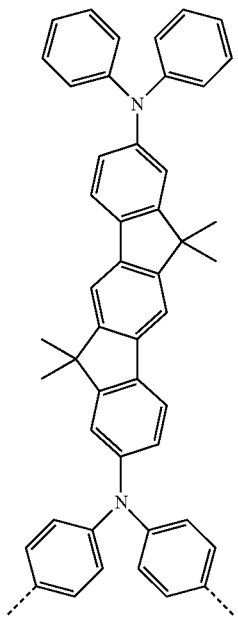

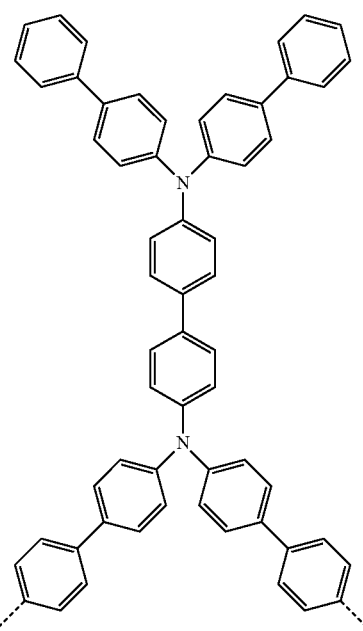

Formula (57)

In another preferred embodiment the at least one hole transport unit on one or more side-chain(s) of the copolymer is bonded to backbone of the copolymer by a non-conjugated spacer. In this embodiment, the copolymer comprises a repeating unit with the general Formula (58) as follows:

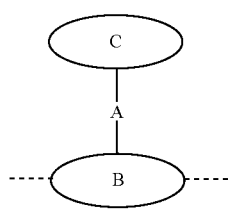

Formula (58)

Wherein B is a group on polymer backbone, which can be an electron transport unit or electron transport backbone group, as described above, or other backbone group; A is a so-called non-conjugated spacer or a conjugation-breaker. A conjugation breaker in the context of the present invention is defined as an entity which disturbs conjugation, preferably an entity which suspends conjugation. This can be, e.g., an entity comprising a sp$^3$ atom, preferably a sp$^3$ carbon atom. Conjugation can also be disturbed by another atom, such as N, P or S.

Preference is given to A independently selected form linear or branched alkylenes, cycloalkylenes, alkylsilylenes, silylenes, arylsilylenes, alkylalkoxyalkylenes, arylalkoxyalkylenes, alkylthioalkylenes, sulfones, alkylensulfones, sulfonoxides, alkylensulfonoxides, wherein the alkylenes have independently from each other 1 to 12 C-atoms, wherein one or more H-atoms can be substituted with F, Cl, Br, I, alkyl, heteroalkyl, cycloalkyl, aryl or heteroaryl groups.

Particular preference is given to A being a linear or branched alkylene or alkoxyalkylene with 1 to 12 C-atoms, wherein one or more H-atoms can be substituted with F.

Preferred polymer repeating unit according the general Formula (58) are those of Formulae (59) to (63).

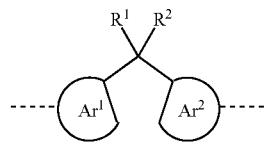

Formula (59)

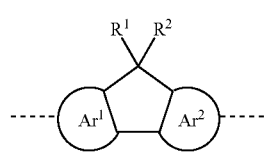

Formula (60)

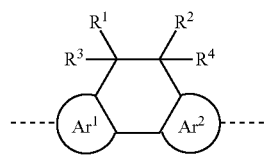

Formula (61)

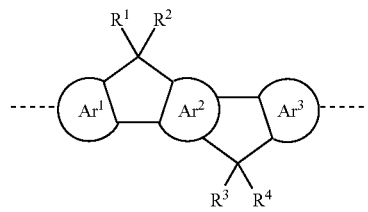

Formula (62)

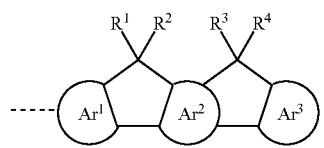

Formula (63)

Where: Ar$^1$, Ar$^2$ and Ar$^3$ are, independently from each other, selected from aromatic or heteroaromatic group with 5 to 60 ring atoms, the bonds into the polymer main chain are shown as the dash lines; and R$^1$, R$^2$, R$^3$, and R$^4$ are independently from each other, selected from C, Alkylen, Cycloalkylen, Alkylsilylen, Silylen, Arylsilylen, Alkylalkoxyalkylen, Arylalkoxyalkylen, Alkylthioalkylen, Phosphin, Phosphinoxid, Sulfon, Alkylensulfon, Sulfonoxid, Alkylensulfonoxid, aryl or heteroaryl groups, wherein the Alkylene group independently from each other comprises 1 to 12 C-Atoms, and one or more H-Atom may be replaced by F, Cl, Br, I, Alkyl, Heteroalkyl, Cycloalkyl, a Aryl- or Heteroaryl group. And at least one of R$^1$ and R$^2$ in Formulae (59) and (63), and at least one of R$^1$-R$^4$ in Formulae (61) to (63) comprises a group of A$^h$, as described above. Optionally the R$^1$ and R$^2$ in Formulae (59) to (63), and R$^3$ and R$^4$ in Formulae (62) and (63) can bonded together to form a ring structure.

The substituents R$^1$ to R$^4$ of Ar$^1$, Ar$^2$ or Ar$^3$ can either be neighbouring or separated from each other by one or more ring atoms. R$^1$ to R$^4$ are bound to ring atoms of the aromatic or heteroaromatic group.

Very preferred polymer repeating unit according the general Formula (58) are those as follows:

Formula (64)
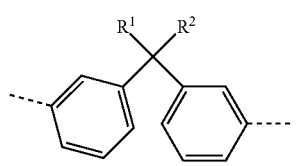
Formula (65)
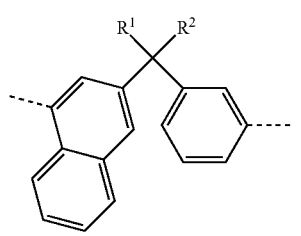
Formula (66)
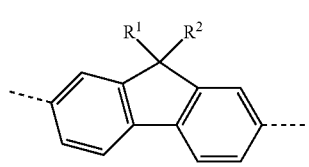
Formula (67)
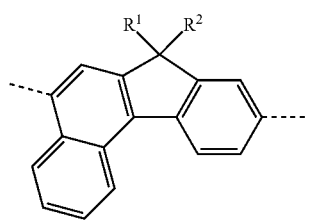
Formula (68)
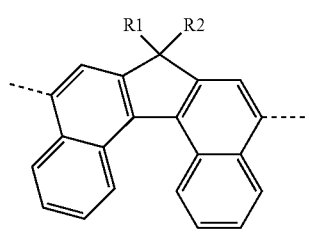
Formula (69)
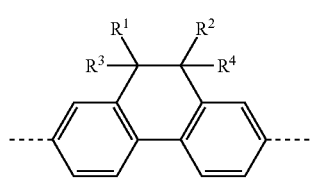
Formula (70)
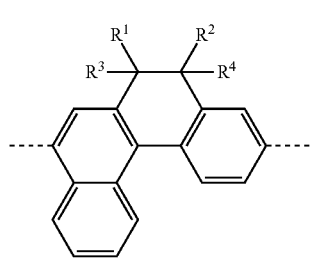
Formula (71)
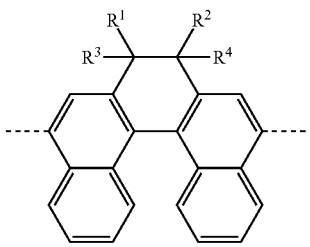
Formula (72)
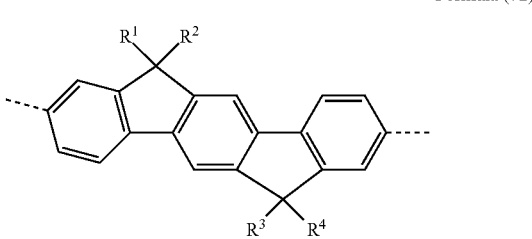
Formula (73)
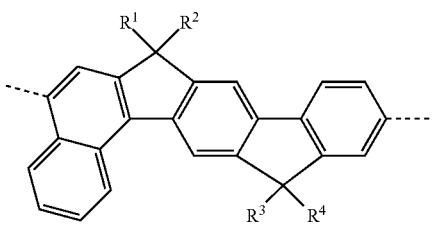
Formula (74)
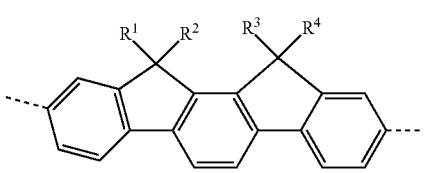
Formula (75)
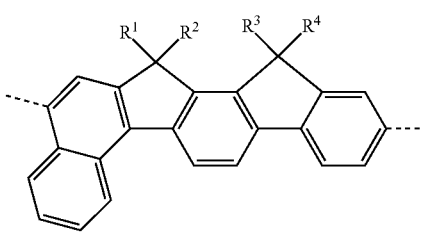
wherein $R^1$ to $R^4$ have the same meaning as in Formulae (59) to (63).
Particularly preferably, the polymer repeating unit having an $A^h$ group on side chain is selected from the group consisting of the following Formulae (76) to (121).

Formula (76)
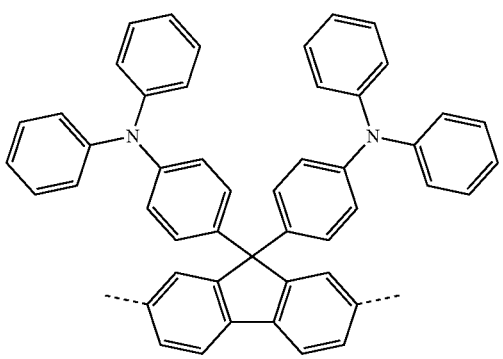
Formula (77)
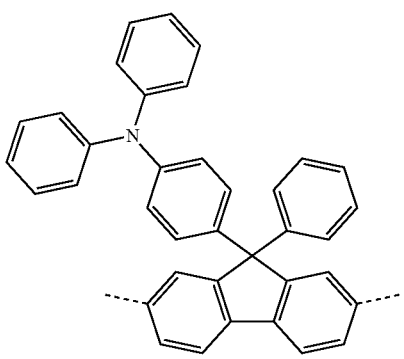
Formula (78)
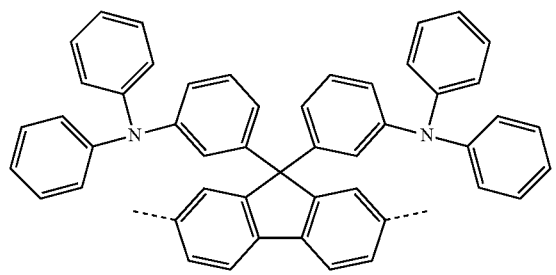
Formula (79)
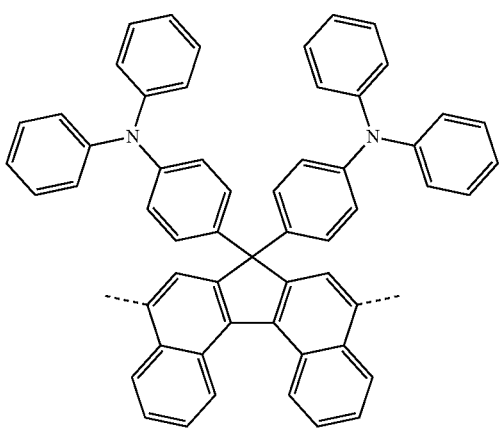
Formula (80)
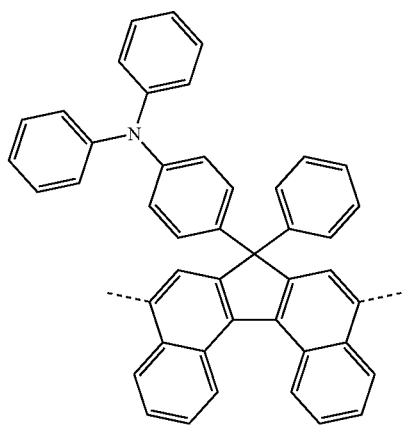
Formula (81)
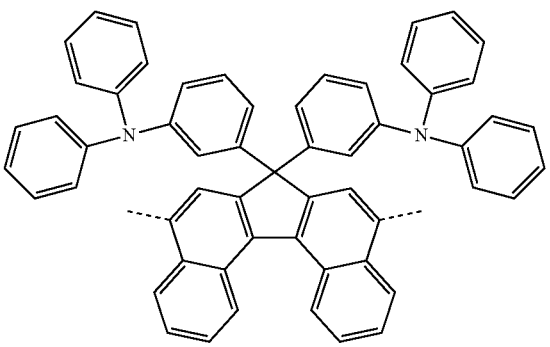
Formula (82)
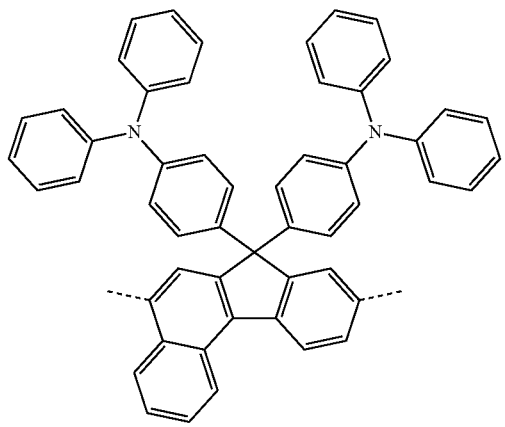
Formula (83)
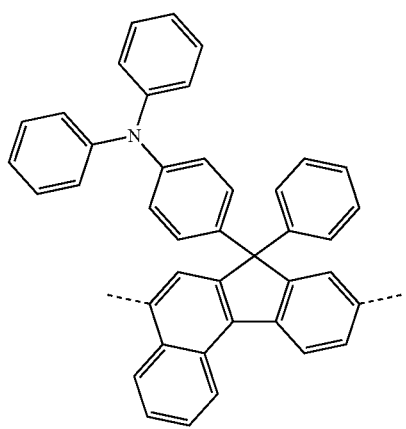

Formula (84)
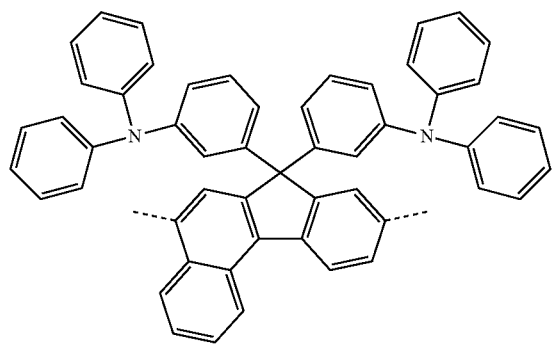
Formula (85)
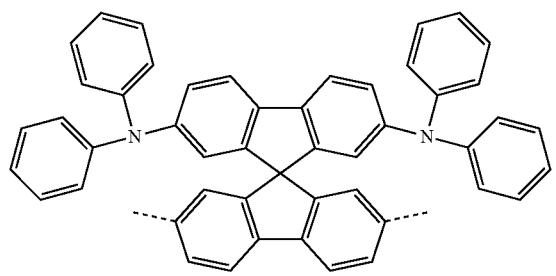
Formula (86)
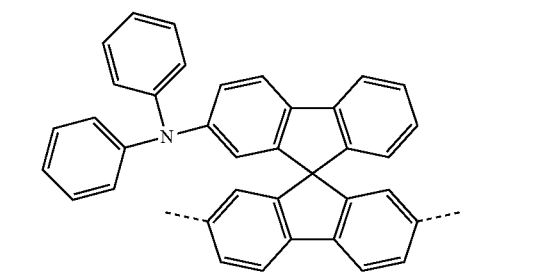
Formula (87)
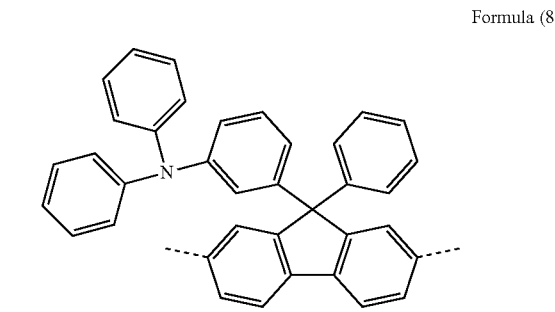
Formula (88)
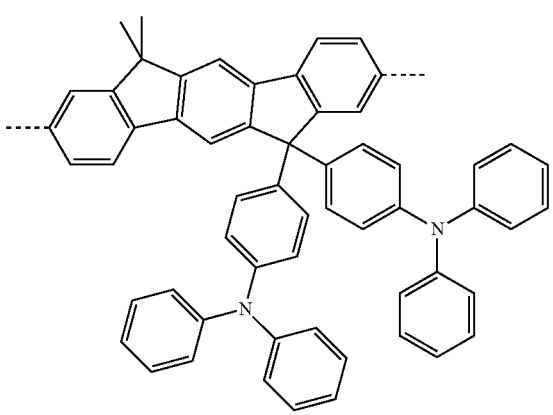
Formula (89)
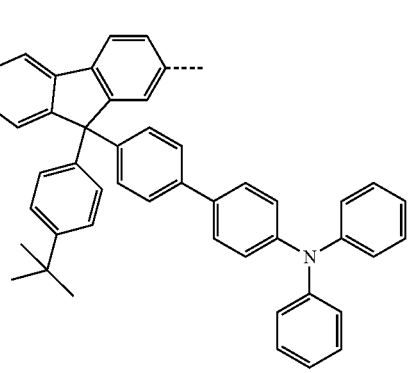
Formula (90)
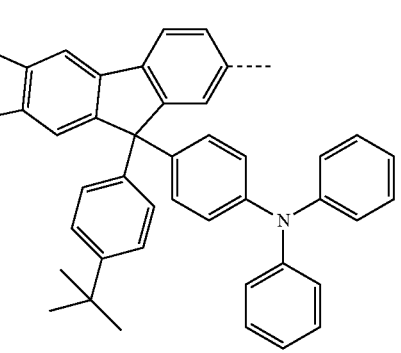
Formula (91)
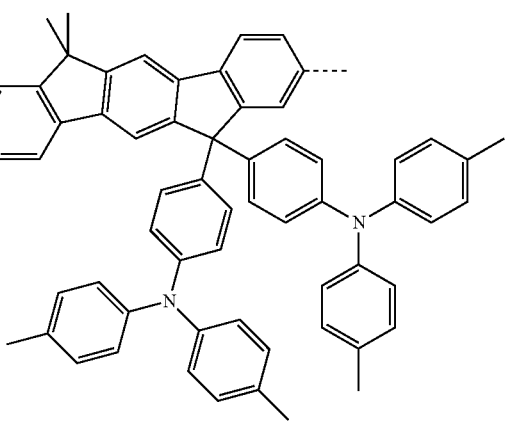

Formula (92)
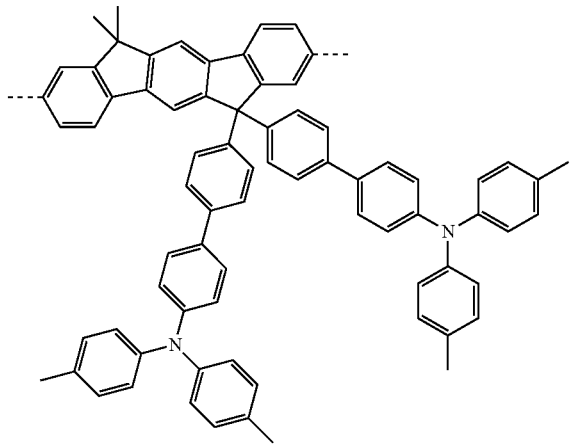
(Formula 93)
Formula (94)
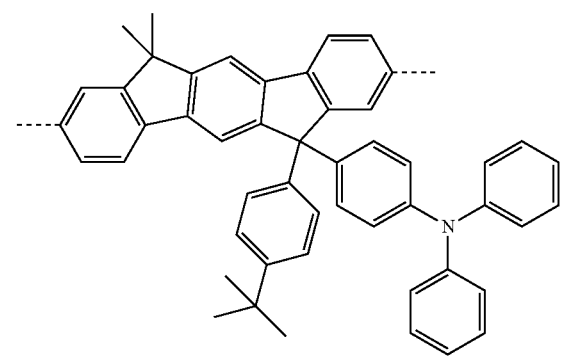
Formula (95)
Formula (96)
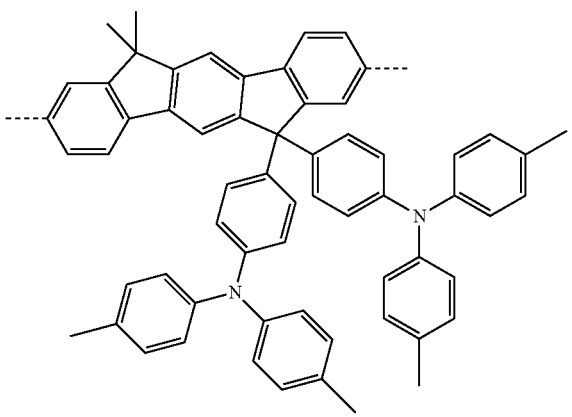
Formula (97)
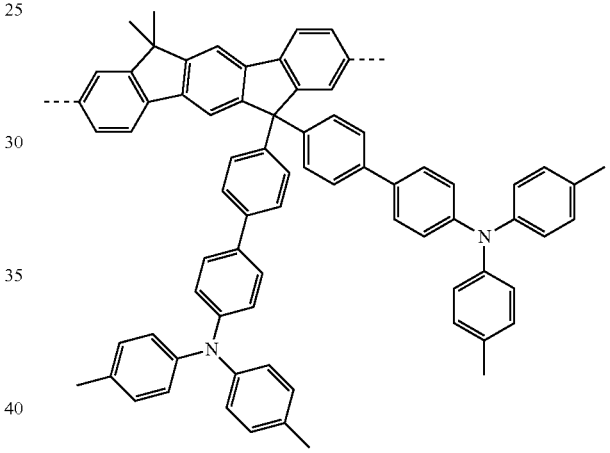
Formula (98)
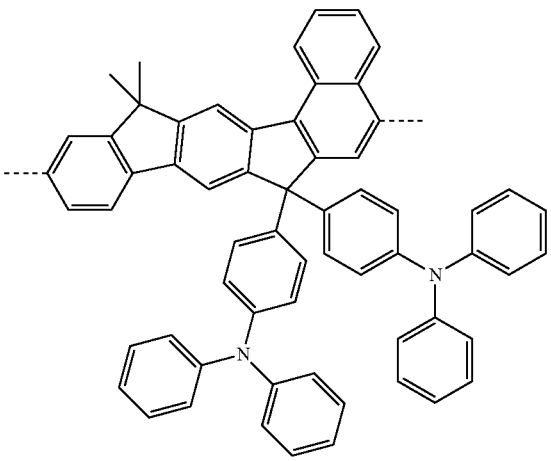

Formula (99)
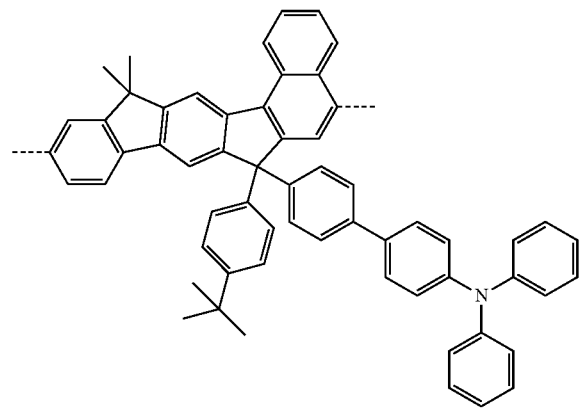
Formula (100)
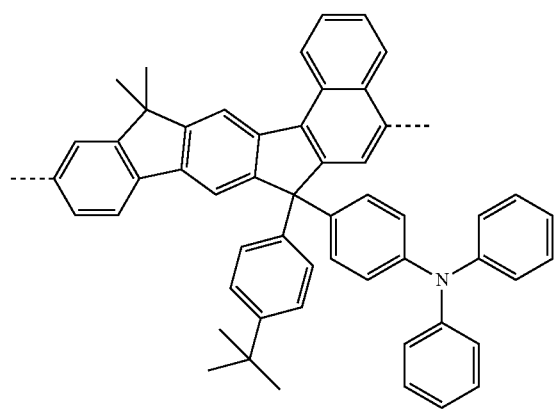
Formula (101)
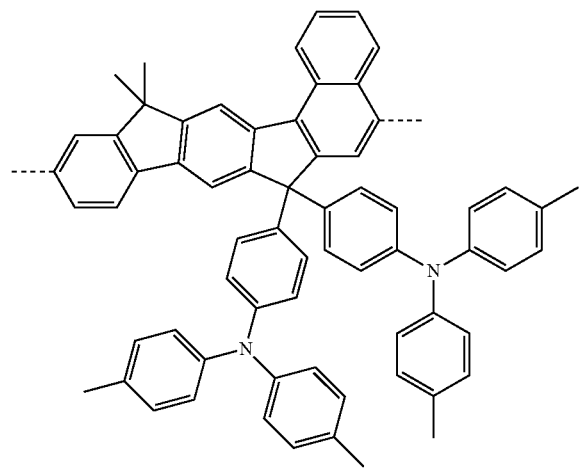
Formula (102)
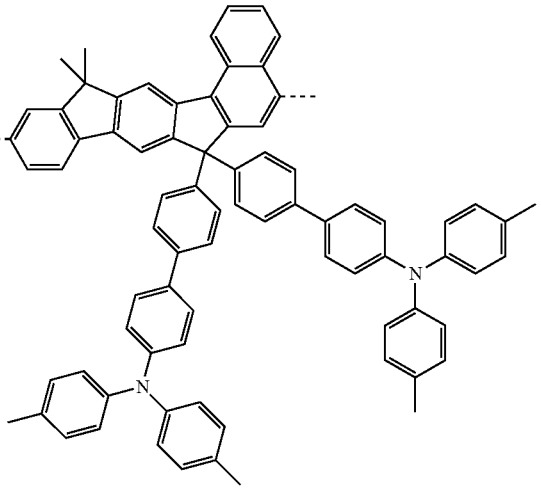
Formula (103)
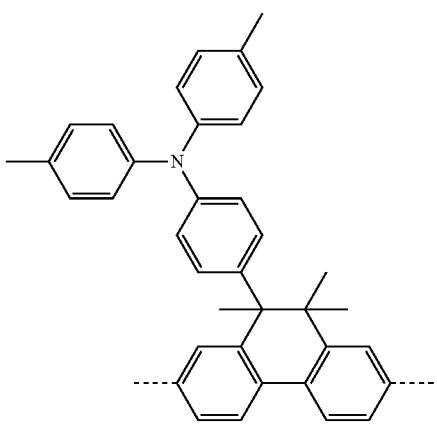
Formula (104)
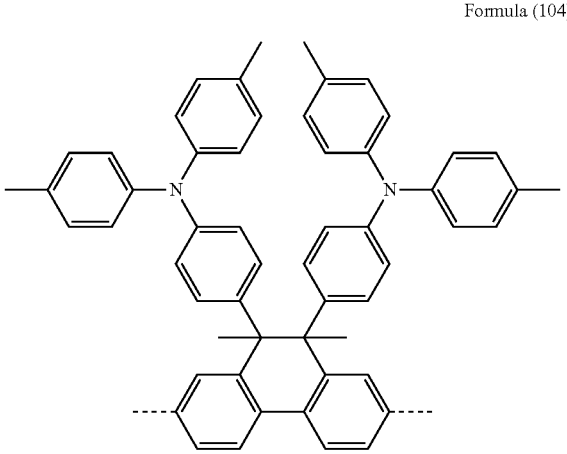

Formula (105)
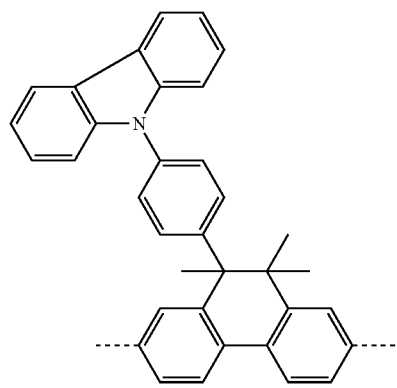
Formula (106)
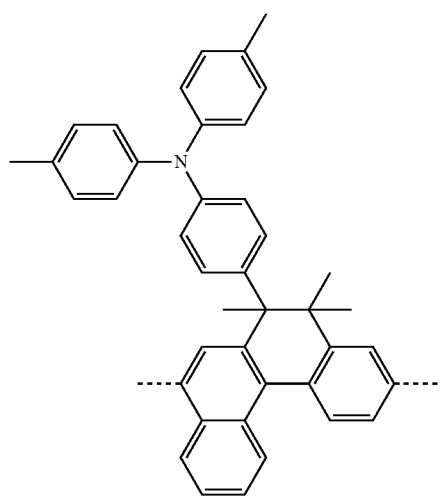
Formula (107)
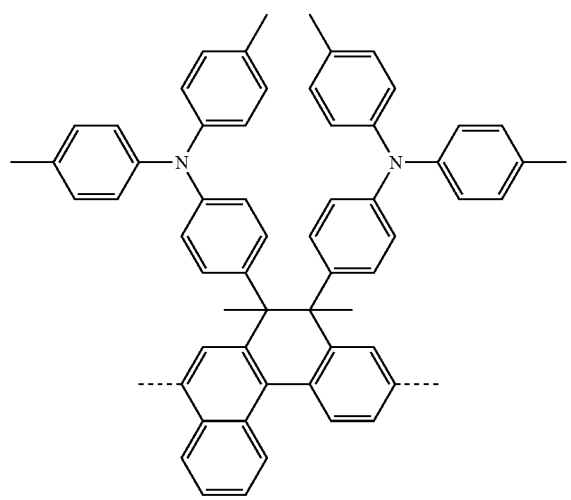
Formula (108)
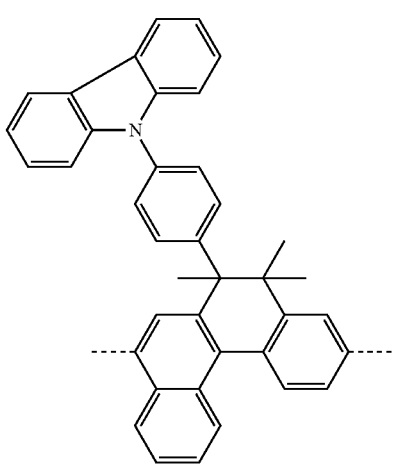
Formula (109)
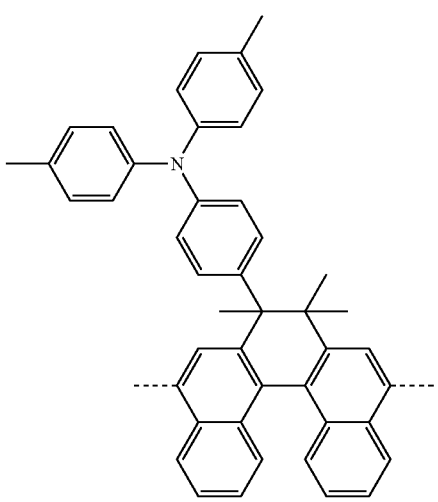
Formula (110)
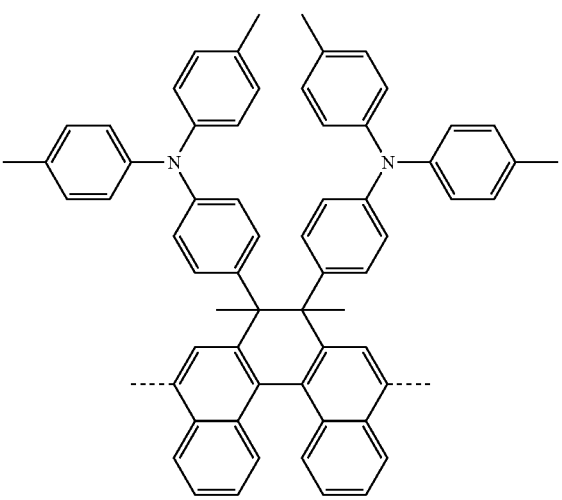

Formula (111)
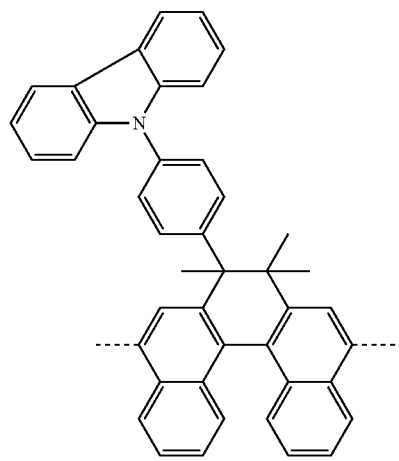
Formula (112)
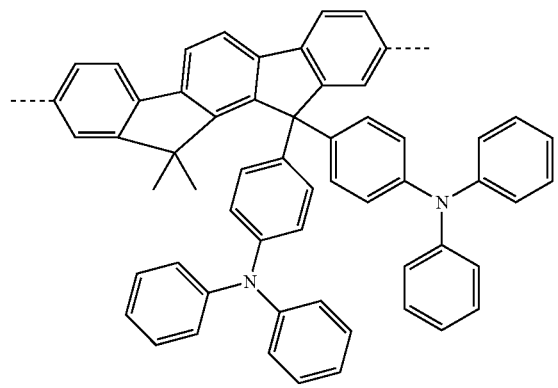
Formula (113)
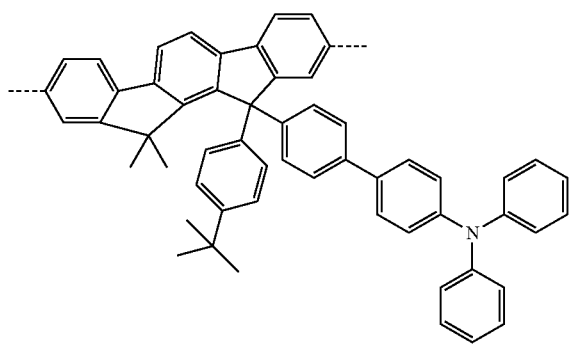
Formula (114)
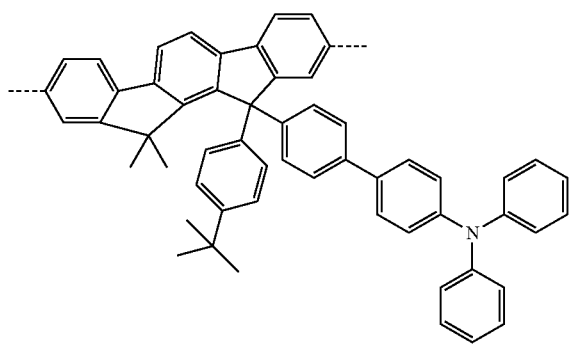
Formula (115)
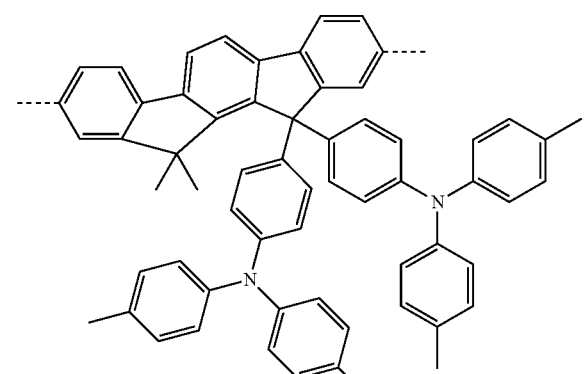
Formula (116)
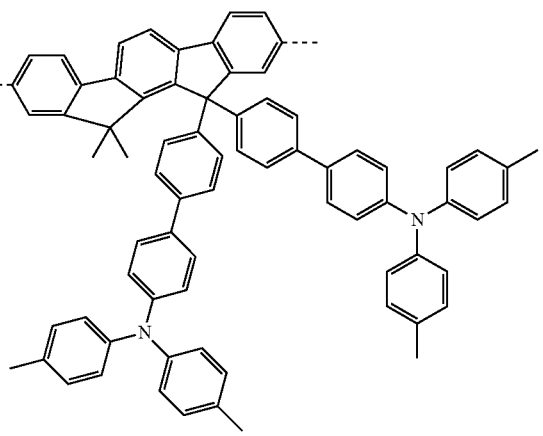
Formula (117)
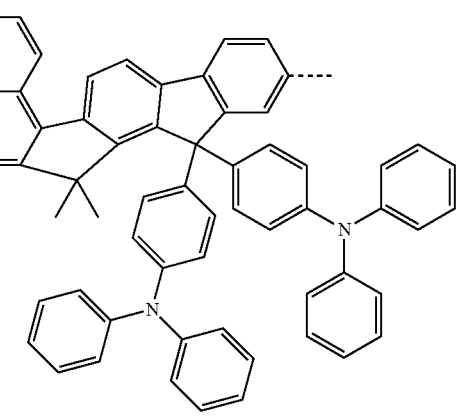

Formula (118)

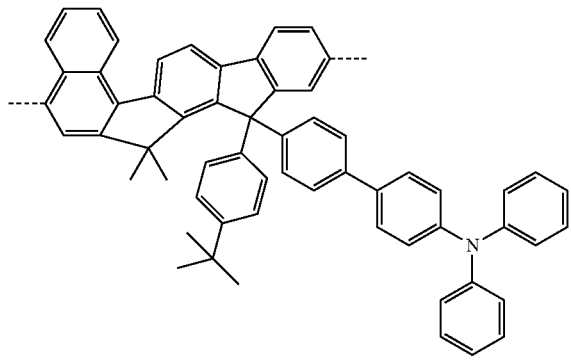

Formula (119)

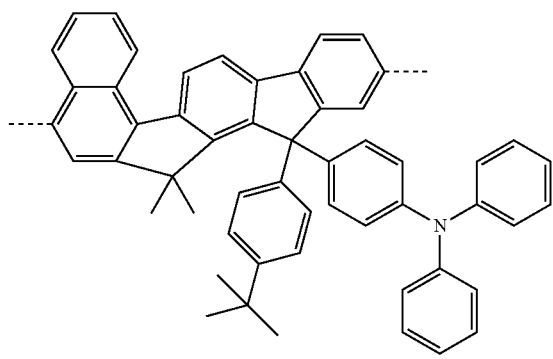

Formula (120)

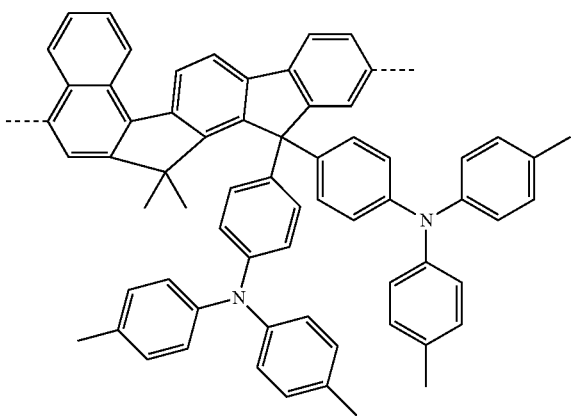

Formula (121)

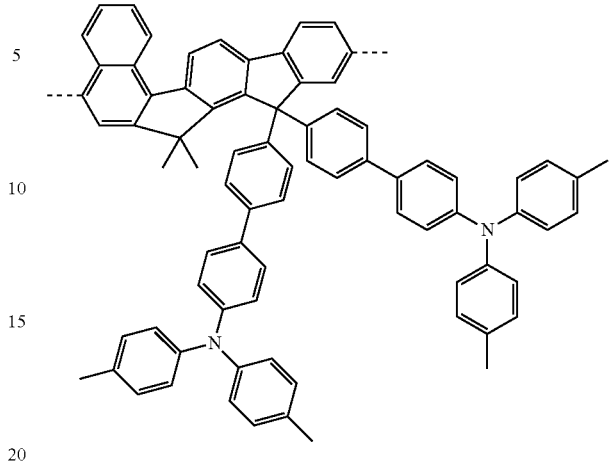

Within the meaning of the present invention "unit A" is as, outlined above and due to the requirements of the energy levels of the frontier orbitals, an organic material or unit, wherein holes and electrons are likely to recombine to form an exciton, or which can form an exciton by optical excitation, i.e by absorbing one photon.

In a preferred embodiment, the present invention relates to a polymer light emitting diode. Unit A in such copolymer can be defined by the appropriate energy level alignment and adjusting of the concentration of the according unit. In the present invention, the preferred arrangement are: 1) the HOMO of unit A is at least 0.3 eV, preferably 0.4 eV higher than the electron transport unit; 2) the HOMO of unit A is higher than, preferably at least 0.1 eV higher than the hole transport unit; 3) the ratio of unit A ($A^{ex}$) in the copolymer is from 0.01 to 10 mol %, preferably from 0.01 to 8 mol %, very preferably from 0.05 to 4 mol %, and most preferably from 0.05 to 2.5 mol %.

In general, all $A^h$ groups as described above may be suitable as unit A, if they are incorporated in the copolymer according the arrangement as described above.

According to a preferred embodiment the copolymer comprises one or more identical or different groups of Formula (122) as unit A:

Formula (122)

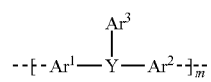

In Formula (122)

Y is N, P, P=O, $PF_2$, P=S, As, As=O, As=S, Sb, Sb=O or Sb=S, $Ar^1$, which may be the same or different, denote, independently if in different repeat units, a single bond or an optionally substituted mononuclear or polynuclear aryl group, $Ar^2$, which may be the same or different, denote, independently if in different repeat units, an optionally substituted mononuclear or polynuclear aryl group, $Ar^3$, which may be the same or different, denote, independently if in different repeat units, an optionally substituted mononuclear or polynuclear aryl group, m is 1, 2 or 3, and In a preferred embodiment Ar³, which may be the same or different, denote, independently if in different repeat units, an optionally substituted mononuclear or polynuclear aryl group, which is substituted by a bridging group linking different chain residues of Formula (26).

Suitable examples for mononuclear aryl, polynuclear aryl, silyl, aromatic or heteroaromtic group, alkyl, cycloalkyl, alkoxy, aralkyl, aryloxy, arylthio, alkoxycarbonyl are those mentioned above.

Preferably, the copolymer comprises one or more identical or different groups of Formula (123) as unit A:

Formula (123)

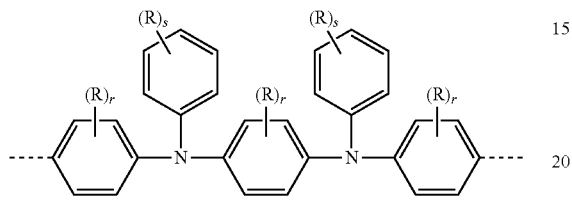

In Formula (123)

R, which may be the same or different, is selected from substituted or unsubstituted aromatic or heteroaromtic group, alkyl, cycloalkyl, alkoxy, aralkyl, aryloxy, arylthio, alkoxycarbonyl, silyl, carboxy group, a halogen atom, cyano group, nitro group or hydroxy group or a single bond bonded to the polymer backbone, r is 0, 1, 2, 3 or 4, and s is 0, 1, 2, 3, 4 or 5.

Suitable examples for aromatic or heteroaromtic group, alkyl, cycloalkyl, alkoxy, aralkyl, aryloxy, arylthio, alkoxycarbonyl, silyl are those mentioned above.

In one preferred embodiment, the unit A is bonded on/to the polymer backbone in a conjugated manner, more preferably in a conjugated polymer backbone. The preferred polymer repeating units are, for example, the repeating units with Formulae (124) to (129):

Formula (124)

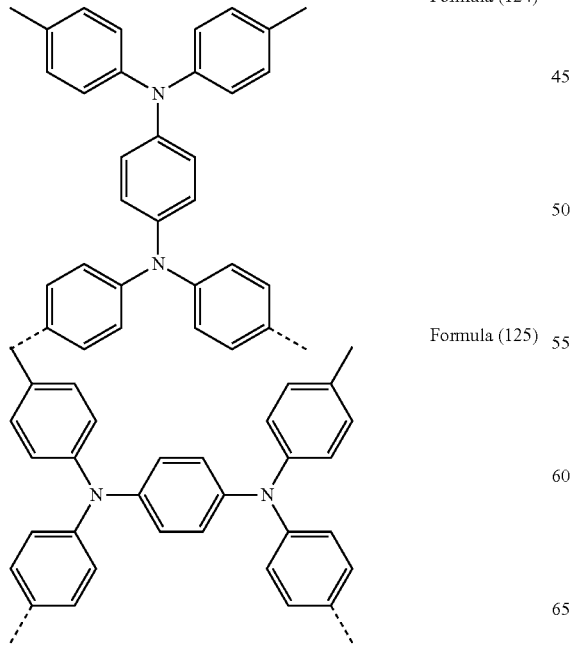

Formula (125)

Formula (126)

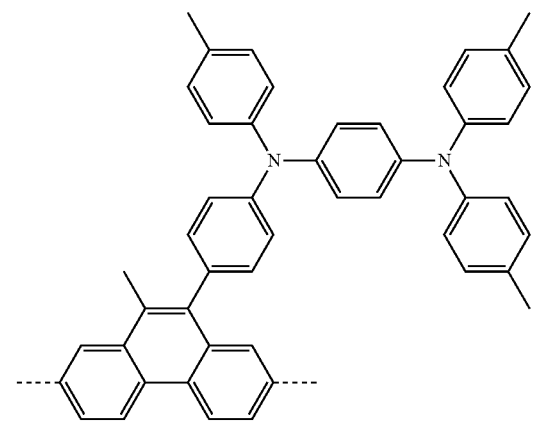

Formula (127)

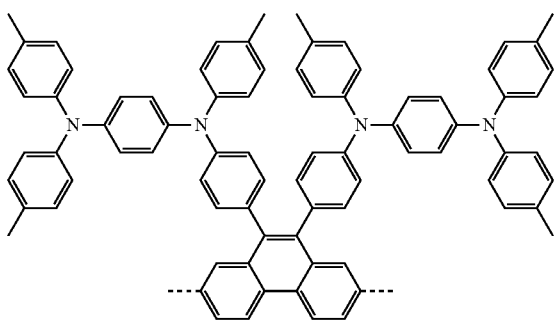

Formula (128)

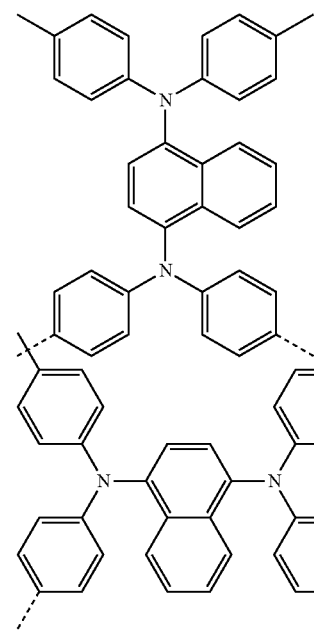

Formula (129)

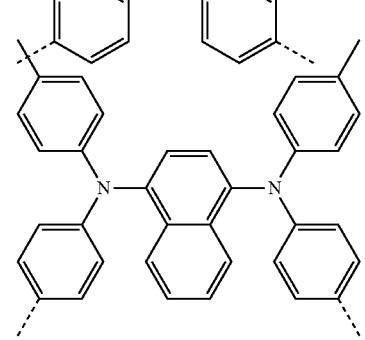

In another preferred embodiment, unit A is bonded to the polymer backbone through a non-conjugated spacer, which may be preferably in a general form according to Formula (58). The preferred polymer repeating units are for example selected from the group consisting of the following Formulae (130) to (154).

Formula (130)
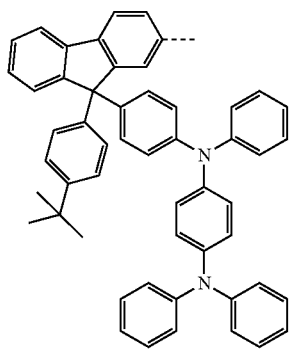
Formula (130)
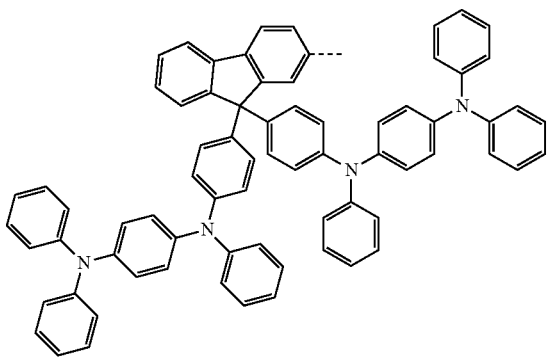
Formula (132)
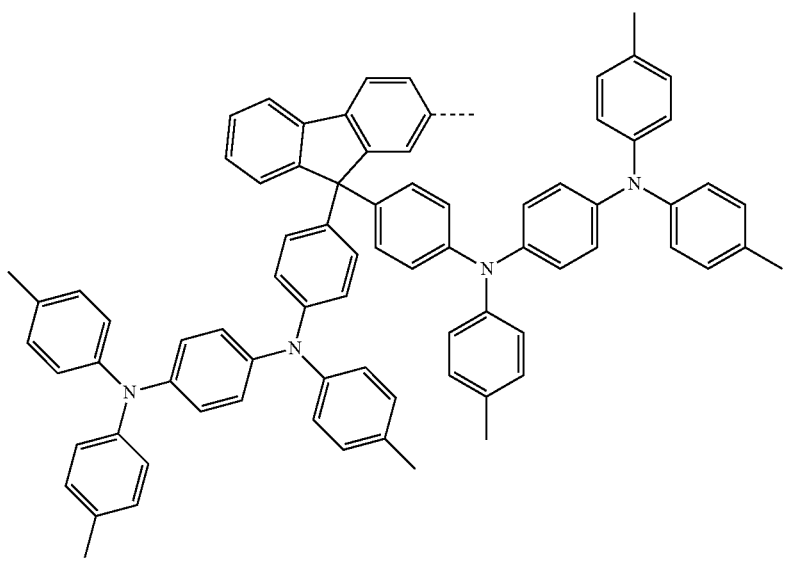
Formula (133)
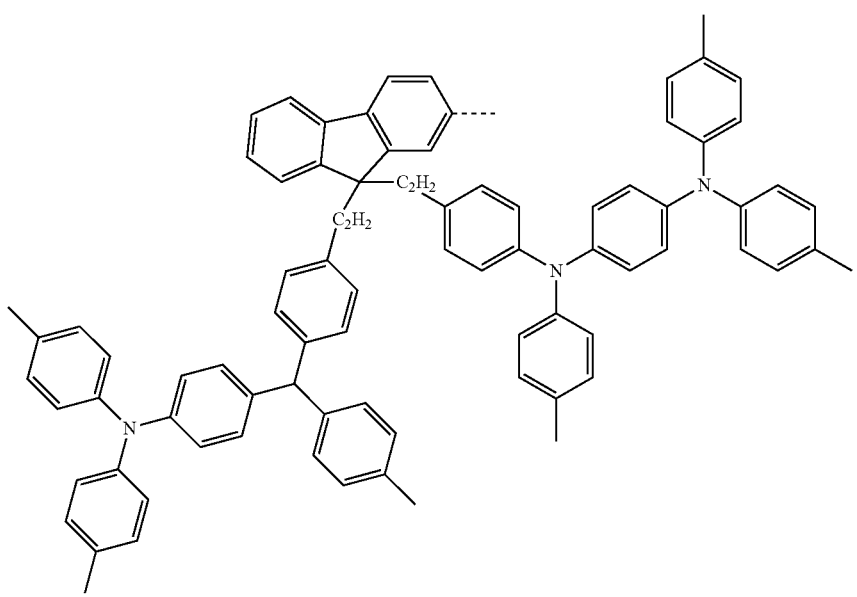

-continued
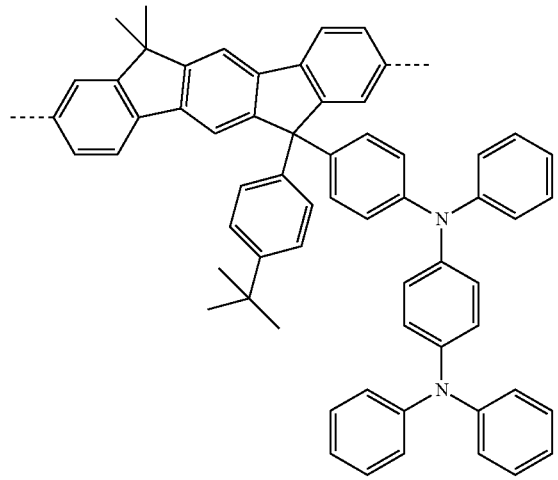
Formula (134)
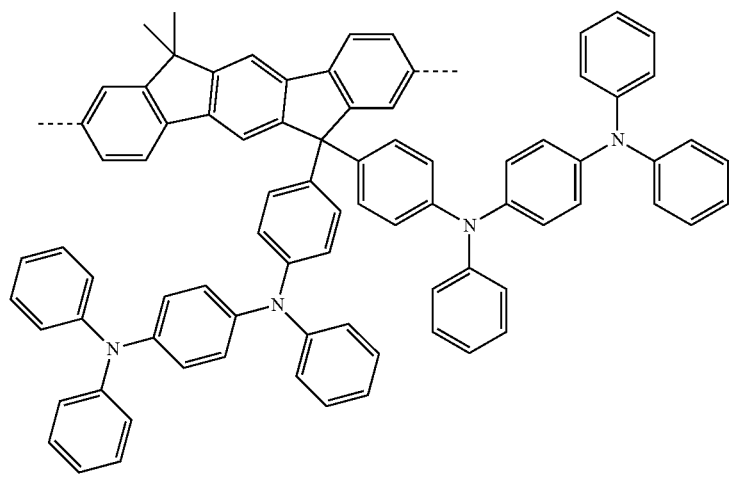
Formula (135)
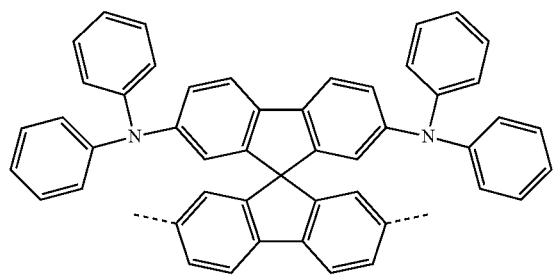
Formula (136)

Formula (137)
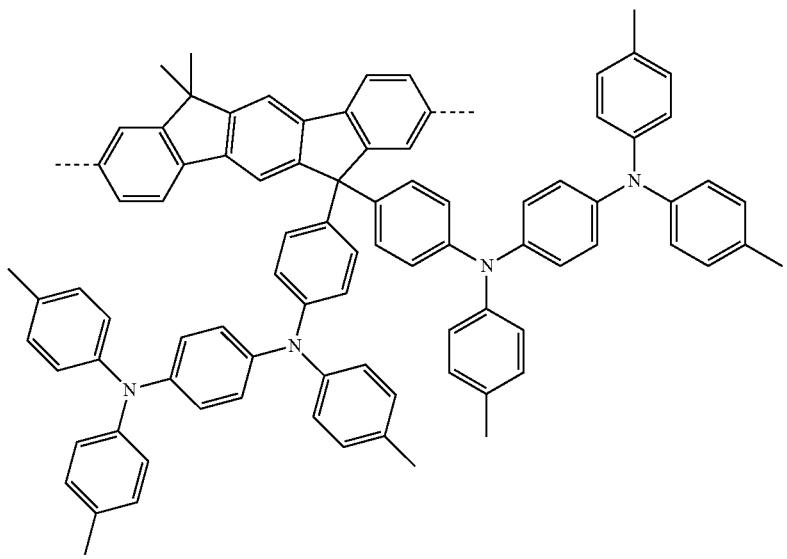
Formula (138)
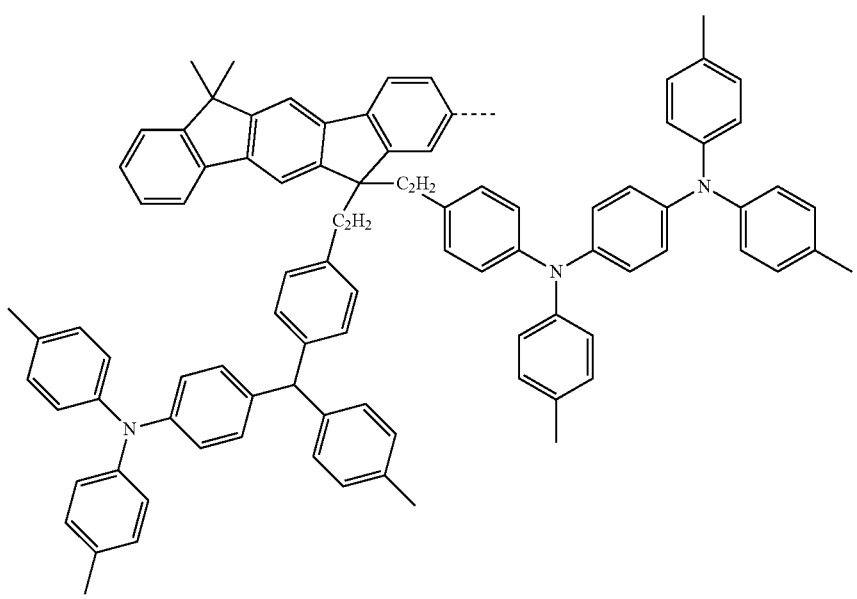
Formula (139)
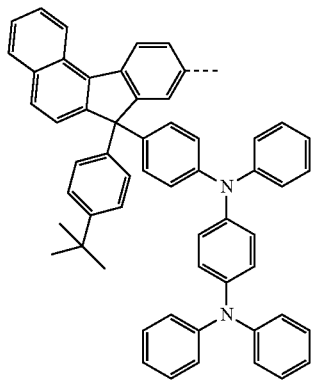
Formula (140)
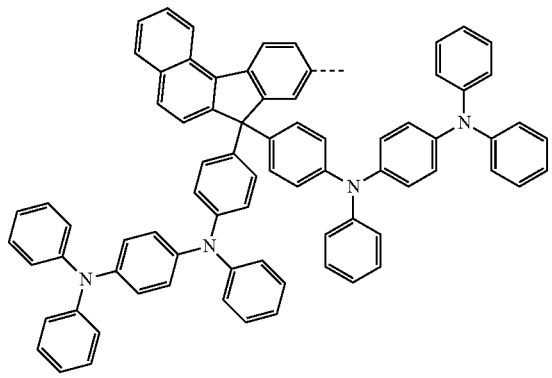

Formula (141)
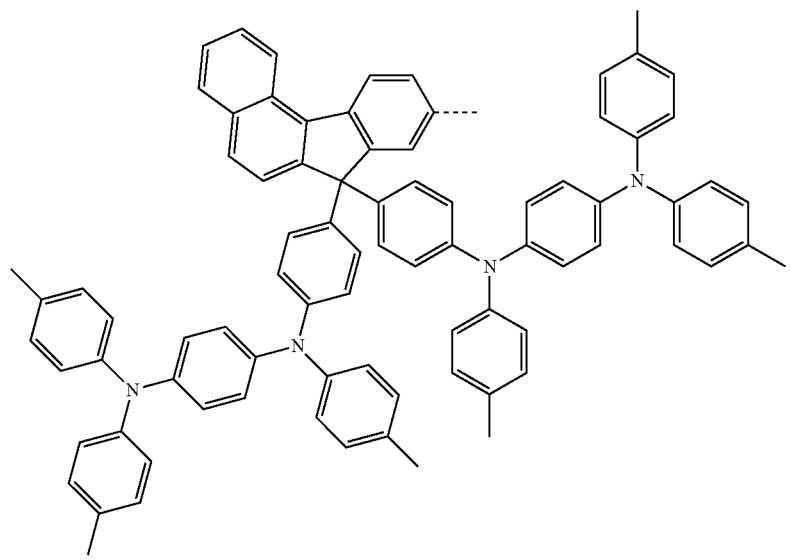
Formula (142)
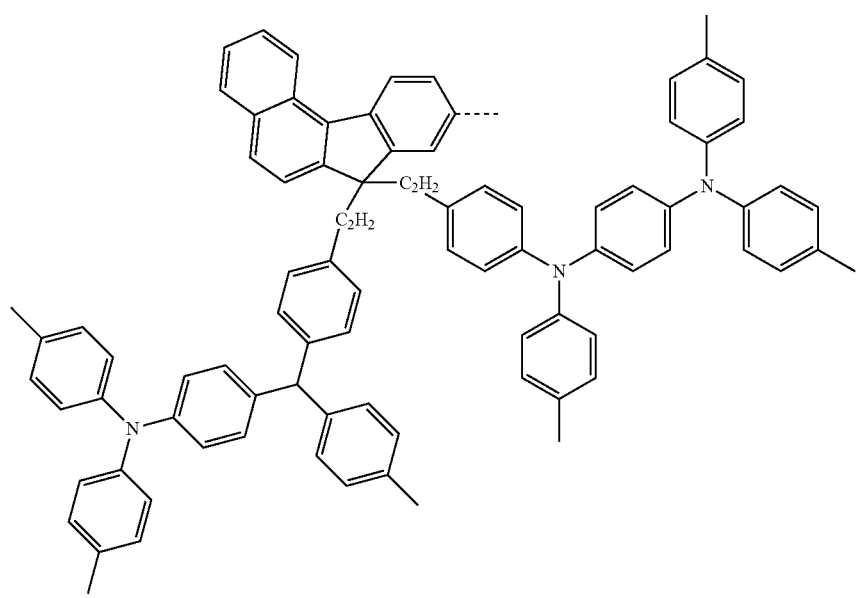
Formula (143)
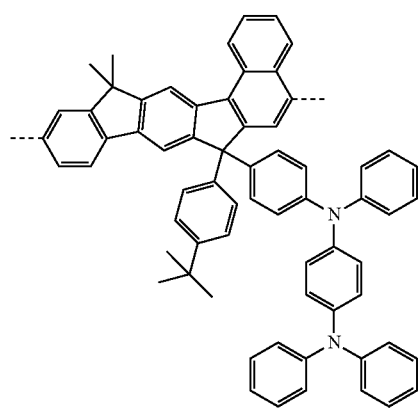
Formula (144)
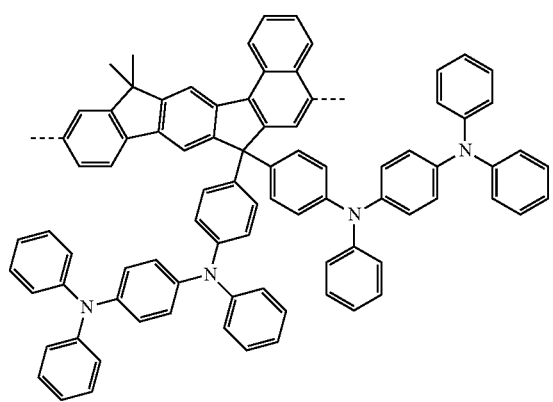

Formula (145)
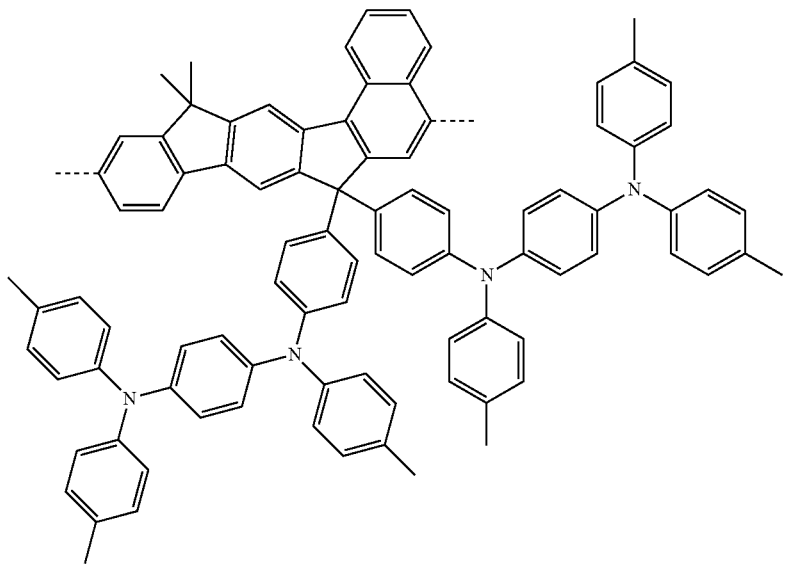
Formula (146)
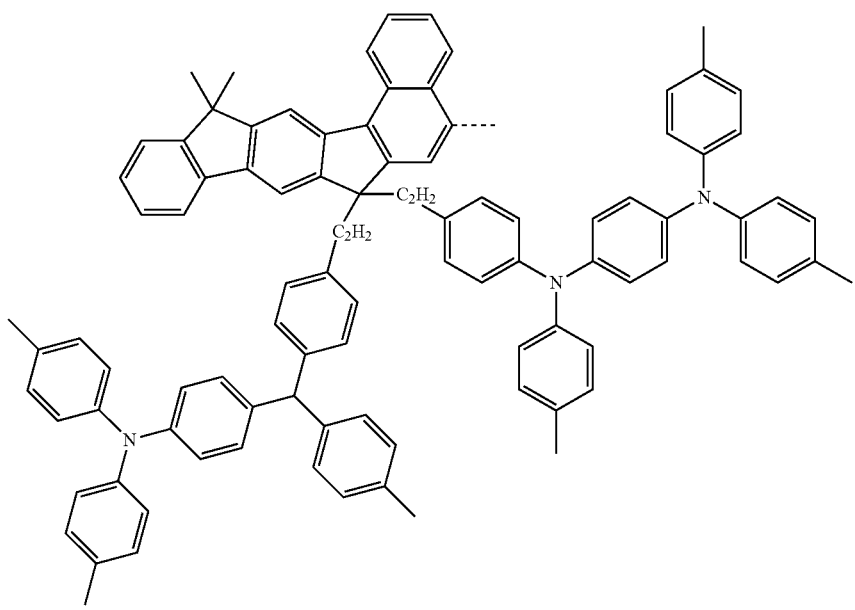
Formula (147)
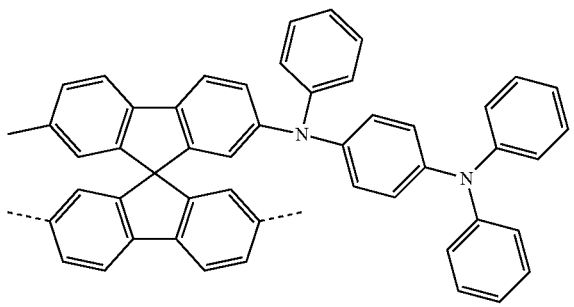

Formula (148)
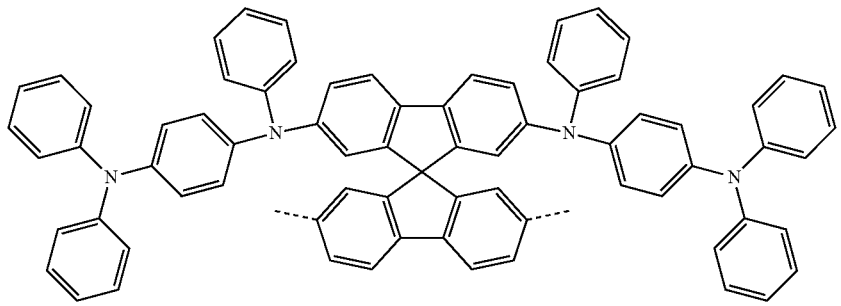
Formula (149)
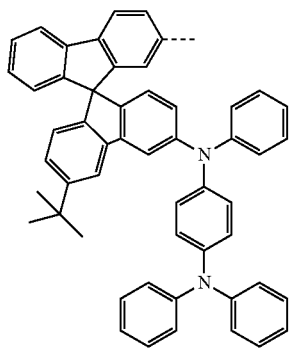
Formula (150)
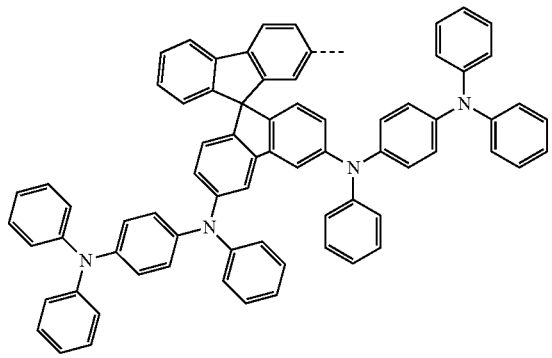
Formula (151)
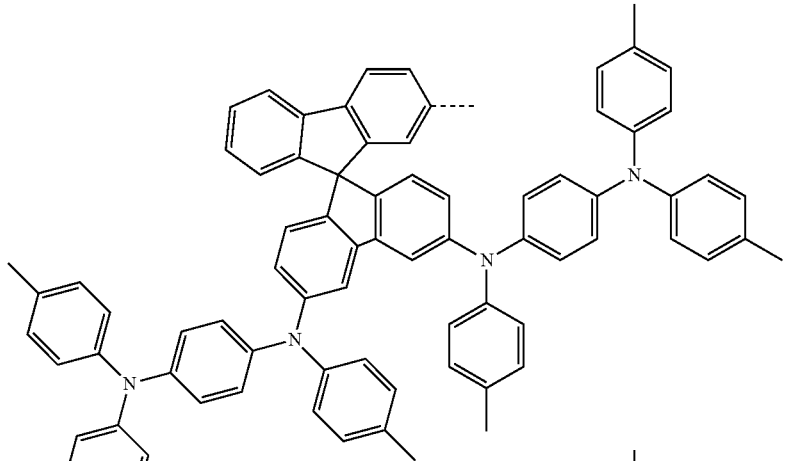
Formula (152)
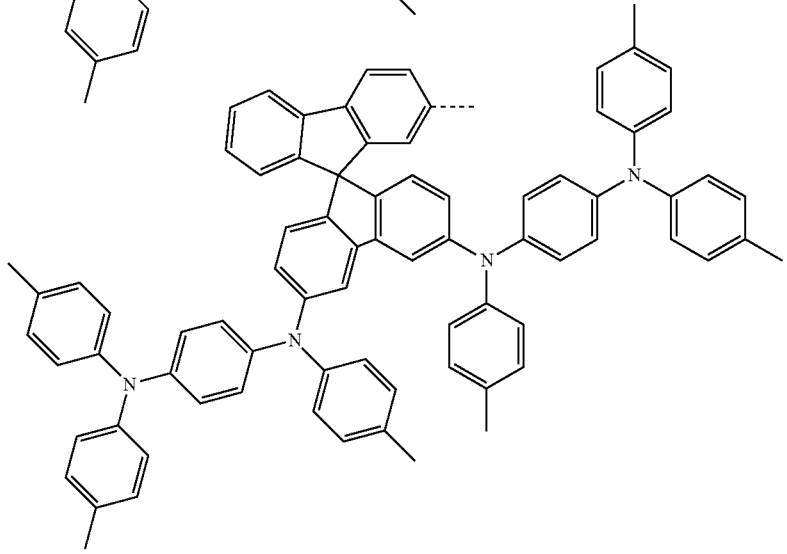

Formula (153)

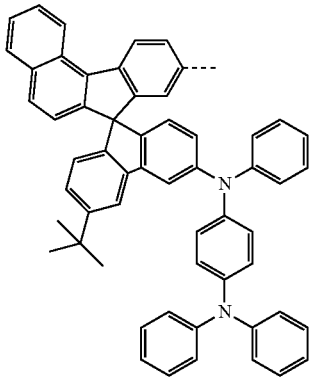

Formula (154)

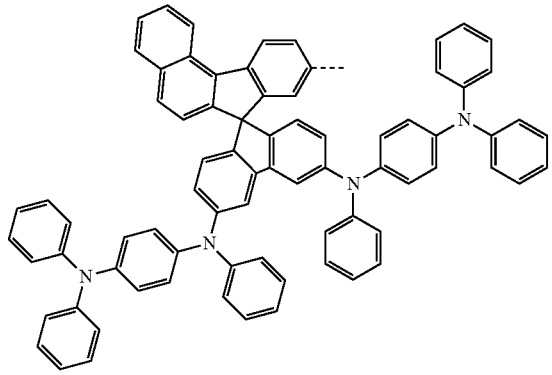

In a preferred embodiment the unit A is itself an emissive unit, i.e. it has exciton formation properties and emissive properties.

The units A described above are preferably suitable for fluorescent polymer or singlet polymer. In a yet further embodiment, the present invention also relates to a phosphorescent polymer. The appropriate unit A is then selected from metal-complex as described below, if they fit to the arrangement of HOMO and concentration according to present invention.

Within the meaning of the present invention "emitter" or "emitter unit", also called "emissive unit" is an organic group that, upon receiving excitonic energy by energy transfers from other units, or by forming an exciton either electrically or optically, undergoes radiative decay to emit light In a preferred embodiment the copolymer according to the invention comprises emissive units that emit blue, green and/or red light.

The copolymer of the invention may comprise two or more different emitter units, for example two emitter units of different type and/or emitter units that emit light of different colors. Thus, a device of the present invention may provide white light. According to a preferred embodiment the emitter units are independently selected from fluorescent materials and phosphorescent materials. In one embodiment one emitter unit is selected from fluorescent materials and the other emitter unit is selected from phosphorescent materials.

Preferably, the emitter has a smaller band gap than unit A.

The term phosphorescence as used herein is defined as luminescence from an excited state with a spin multiplicity (2S+1) of larger than 1, wherein S is the spin. The excited state may be, for instance, a quintet or triplet state, preferably the excited state is a triplet state. Preferred phosphorescent molecules are luminescent complexes comprising iridium and platinum.

In a preferred embodiment, the copolymer of the present invention comprises a vinyltriarylamine and/or its derivatives as emitter. An example of an emissive conjugated polymer comprising vinyltriarylamine and its derivatives as emitter is disclosed in WO 2007/068325.

According to a further embodiment the copolymer comprises one or more identical or different groups based on thiostilbene as emitter. An example of a emissive conjugated polymer comprising thiostilbene and its derivatives as emitter is disclosed in WO 2010/022847.

The emitter unit is required to have a smaller band gap as compared to unit A and/or electron transport unit. In general, smaller band gaps can be achieved by extending the π-electron system of conjugated molecular systems.

In general, any small molecular emitter known to one skilled in the art may be incorporated in the copolymer of the present invention. Many examples have been published, e.g. styrylamine derivatives as disclosed in JP 2913116B and WO 2001/021729 A1, and indenofluorene derivatives as disclosed in WO 2008/006449 and WO 2007/140847.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4, 4'-(bis(9-ethyl-3-carbazovinylene)-1,1'-biphenyl, fluorene, arylpyrenes (US 2006/0222886), arylenevinylenes (U.S. Pat. No. 5,121,029, U.S. Pat. No. 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, periflanthene, indenoperylene, bis(azinyl)imine-boron compounds (US 2007/0092753 A1), bis(azinyl)methene compounds and carbostyryl compounds.

Further preferred blue fluorescent emitters are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

Furthermore, dopant has the same meaning as emitter in the present invention. Dopants known to the one skilled in the art may also be incorporated in the copolymer of the present invention.

Preferred dopants are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. The corresponding phosphines and ethers are defined analogously to the amines. For the purposes of this invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracene-amines, aromatic anthracene-diamines, aromatic pyrene-amines, aromatic pyrene-diamines, aromatic chrysene-amines and aromatic chrysene-diamines. An aromatic anthracene-amine is taken to mean a compound in which one diarylamino group is bonded directly to an anthracene group, preferably in the 9 position. An aromatic anthracene-diamine is taken to mean a compound in which two diarylamino groups are bonded directly to an anthracene group, preferably in the 9,10-position. Aromatic pyrene-amines, pyrene-diamines, chrysene-amines and chrysene-diamines are defined analogously thereto, where the diarylamino groups on the pyrene are preferably bonded in the 1 position or in the 1,6-position.

Further preferred dopants are selected from indenofluorene-amines and indenofluorene-diamines, for example in accordance with WO 2006/122630, benzoindenofluorene-amines and benzoindenofluorene-diamines, for example in accordance with WO 2008/006449, and dibenzoindenofluorene-amines and dibenzoindenofluorene-diamines, for example in accordance with WO 2007/140847.

Examples of dopants from the class of the styrylamines are substituted or unsubstituted tristilbene-amines or the dopants described in WO 2006/000388, WO 2006/058737, WO 2006/000389, WO 2007/065549 and WO 2007/115610. Distyryl-benzene and distyryl-biphenyl derivatives are described in U.S. Pat. No. 5,121,029. Further styrylamines are found in US 2007/0122656 A1.

Particularly preferred styrylamine dopants and triarylamine dopants are the compounds of the Formulae (155) to (160) and as disclosed in U.S. Pat. No. 7,250,532 B2, DE 10 2005 058557 A1, CN 1583691A, JP 08053397 A, U.S. Pat. No. 6,251,531B1, and US 2006/210830 A.

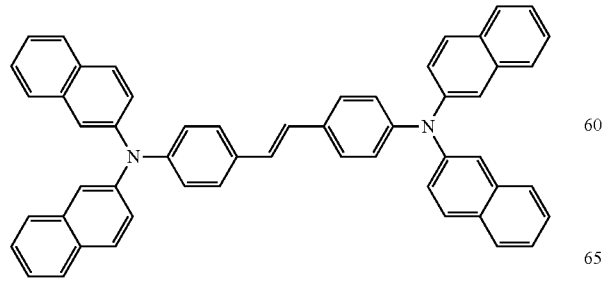

Formula (155)

-continued

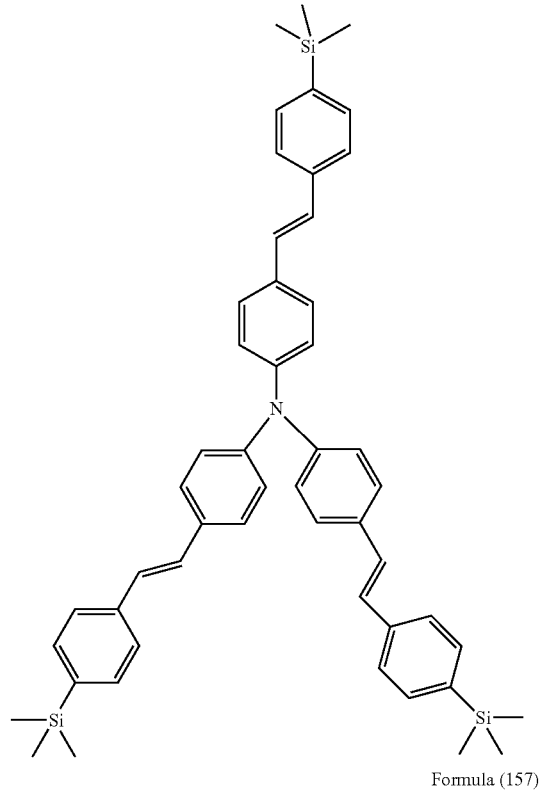

Formula (156)

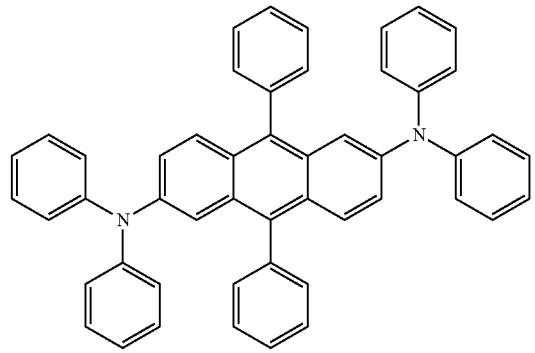

Formula (157)

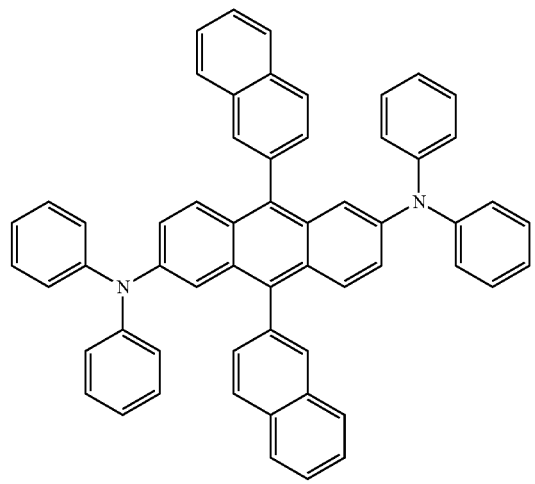

Formula (158)

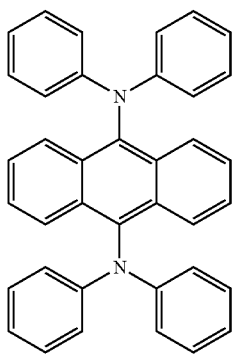

Formula (159)

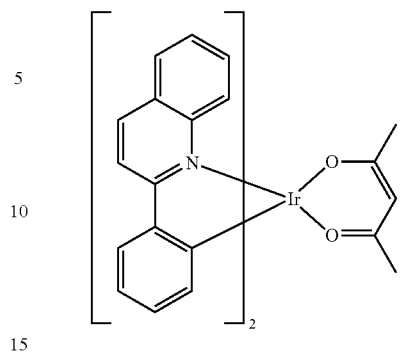

Formula (161)

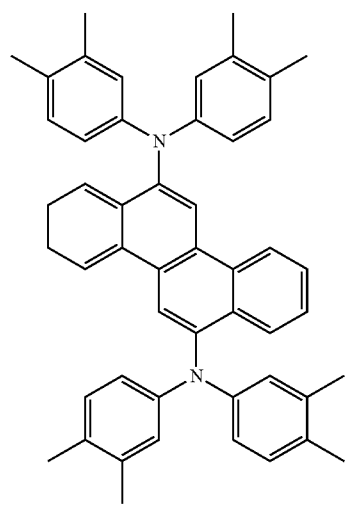

Formula (160)

Further preferred dopants are selected from the group of triarylamines as disclosed in EP 1957606 A1 and US 2008/0113101 A1.

Further preferred dopants are selected from derivatives of naphthalene, anthracene, tetracene, fluorene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. No. 4,769,292, U.S. Pat. No. 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)-benzene is also a preferred dopant.

A particularly preferred phosphorescent dopant is a compound with the Formula (161) and further compounds as disclosed, e.g., in US 2001/0053462 A1.

Further derivatives are described in U.S. Pat. No. 7,378,162 B2, U.S. Pat. No. 6,835,469 B2, and JP 2003/253145 A.

In a further related embodiment the phosphorescent emitter, can also be integrated into the copolymer.

Examples of phosphorescent emitters are revealed by the applications WO 00/70655, WO 01/41512, WO 02/02714, WO 02/15645, EP 1191613, EP 1191612, EP 1191614 and WO 05/033244. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without inventive step.

The triplet emitter may be a metal complex, preferably with the formula $M(L)_z$, wherein M is a metal atom, L is in each occurrence independently of one another an organic ligand that is bonded to or coordinated with M via one, two or more positions, and z is an integer $\geq 1$, preferably 1, 2, 3, 4, 5 or 6, and wherein these groups are linked to the polymer via one or more, preferably one, two or three positions, preferably via the ligands L.

M is in particular a metal atom selected from transition metals, preferably selected from transition metals of group VIII, or lanthanoides, or actinides, particularly preferably selected from Rh, Os, Ir, Pt, Pd, Au, Sm, Eu, Gd, Tb, Dy, Re, Cu, Zn, W, Mo, Pd, Ag, or Ru, and very particularly preferably selected from Os, Ir, Ru, Rh, Re, Pd, or Pt. M may also be Zn.

Preferred ligands are 2 phenylpyridine derivatives, 7,8-benzoquinoline derivatives, 2 (2-thienyl)pyridine derivatives, 2 (1-naphthyl)pyridine derivatives or 2 phenylquinoline derivatives. All these compounds may be substituted, for example by fluoro- or trifluoromethyl substituents for blue. Auxiliary ligands are preferably acetylacetonate or picric acid.

In particular, complexes of Pt or Pd with tetradentate ligands of the Formula (162) as disclosed in US 2007/0087219 A1, wherein $R^1$ to $R^{14}$ and $Z^1$ to $Z^5$ are as defined in the reference, Pt porphyrin complexes having an enlarged ring system (US 2009/0061681 A1) and Ir complexes are suitable, for example 2,3,7,8,12,13,17,18-octaethyl-21H,23H-porphyrin-Pt(II), tetraphenyl-Pt(II)-tetrabenzoporphyrin (US 2009/0061681 A1), cis-bis(2-phenylpyridinato-N,C2')Pt(II), cis-bis(2-(2'-thienyl)pyridinato-N,C3')Pt(II), cis-bis(2-(2'-thienyl)quinolinato-N,C5')Pt(II), (2-(4,6-difluorophenyl)pyridinato-N,C2')Pt(II) acetylacetonate, or tris(2-phenylpyridinato-N,C2')Ir(III) (Ir(ppy)3, green), bis(2-phenylpyridinato-N,C2)Ir(III) acetylacetonate (Ir(ppy)2 acetylacetonate, green, US 2001/0053462 A1, Baldo, Thompson et al. Nature 403, (2000), 750-753), bis(1-phenylisoquinolinato-N,C2')(2-phenylpyridinato-N,C2')iridium (III), bis(2-phenylpyridinato-N,C2')(1-phenylisoquinolinato-N,C2')iridium(III), bis(2-(2'-benzothienyl)-pyridinato-N,C3')iridium(III) acetylacetonate, bis(2-(4',6'-difluorophenyl)-pyridinato-N,C2')iridium(III) piccolinate (Firpic, blue), bis(2-(4',6'-difluoro-phenyl)pyridinato-N,C2') Ir(III) tetrakis(1-pyrazolyl)borate, tris(2-(biphenyl-3-yl)-4-tert-butylpyridine)iridium(III), (ppz)2Ir(5phdpym) (US 2009/0061681 A1), (45ooppz)2Ir(5phdpym) (US 2009/0061681 A1), derivatives of 2 phenylpyridine-Ir complexes, such as, for example, iridium(III) bis(2-phenylquinolyl-N, C2')acetylacetonate (PQIr), tris(2-phenylisoquinolinato-N, C)Ir(III) (red), bis(2-(2'-benzo[4,5-a]thienyl)pyridinato-N, C3)Iracetylacetonate ([Btp2Ir(acac)], red, Adachi et al. Appl. Phys. Lett. 78 (2001), 1622-1624).

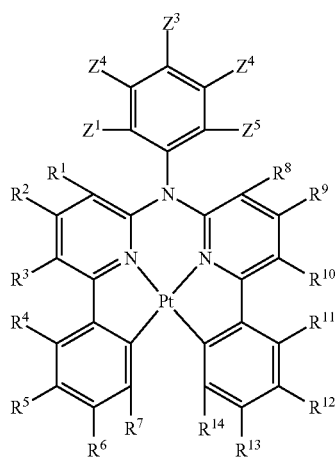

Formula (162)

Also suitable are complexes of trivalent lanthanides, such as, for example, $Tb^{3+}$ and $Eu^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl diimine complexes (Wrighton, JACS 96, 1974, 998 inter alia), Os(II) complexes with cyano ligands and bipyridyl or phenanthroline ligands (Ma et al., Synth. Metals 94, 1998, 245) or $Alq_3$ without a host.

Further phosphorescent emitters with tridentate ligands are described in U.S. Pat. No. 6,824,895 and U.S. Pat. No. 7,029,766. Red-emitting phosphorescent complexes are mentioned in U.S. Pat. No. 6,835,469 and U.S. Pat. No. 6,830,828.

The copolymer of the present invention may further comprise one or more functional groups, which can be selected from HTM, ETM, emitter and backbone groups, as described above and below.

Different structures are, inter alia, those as disclosed and extensively listed in WO 2002/077060 A1 and in DE 10337346 A1. These are regarded as part of the present invention by way of reference.

In a preferred embodiment as described below, the copolymer is tended to coated from solution, for example using printing methods. Therefore, it is highly desired to modify the morphology properties of the copolymer by additional structural element.

Such structural elements, which influence the morphology and/or even emission colour of the polymers, are, besides those mentioned above, those which have at least one further aromatic or another conjugated structure which do not fall under the above-mentioned groups, i.e. which have only little effect on the charge-carrier mobilities, which are not organometallic complexes or which have no influence on the singlet-triplet transition. Structural elements of this type may influence the morphology and/or emission colour of the resultant polymers. Depending on the unit, they can therefore also be employed as emitters. Preference is given here to aromatic structures having 6 to 40 C atoms or also tolan, stilbene or bisstyrylarylene derivatives, each of which may be substituted by one or more radicals $R^1$. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-ter-phenylylene, 4,4'-bi-1,1'-naphthylylene, 4,4'-tolanylene, 4,4'-stilbenzylene or 4,4"-bisstyrylarylene derivatives.

The proportion of such groups, is preferably at least 5 mol %, particularly preferably at least 10 mol %.

Preference is given to copolymers according to the invention which simultaneously comprise one or more units as described above. It may likewise be preferred for more than one unit from a group to be present simultaneously.

In another related embodiment, the copolymer of the present invention may emit broad-band emission, particularly white light, by simultaneous comprising blue, green and red emitters. The way in which white-emitting copolymers can be synthesised is described in detail in DE 10343606 A1.

In order to ensure adequate solubility, it is preferred for on average at least 2 non-aromatic C atoms to be present in the substituents per recurring unit. Preference is given here to at least 4 and particularly preferably at least 8 C atoms. In addition, individual C atoms of these may be replaced by O or S. However, it is entirely possible for this to mean that a certain proportion of recurring units does not carry any further non-aromatic substituents.

In order to avoid impairing the morphology of the film, it is preferred to have no long-chain substituents having more than 12 C atoms in a linear chain, particularly preferably none having more than 8 C atoms and in particular none having more than 6 C atoms.

The said copolymer may be statistical or random copolymers, alternating or regioregular copolymers, block copolymers or combinations thereof.

In a very preferred embodiment, the copolymer comprises a conjugated main-chain, wherein the electron transport unit and the unit A as described above are integrated into the polymer main chain, and the hole transport unit on the side chiain.

In another related embodiment, the copolymer is a non-conjugated or partially-conjugated polymer.

In a preferred embodiment, the said polymer comprises a non-conjugated main-chain, wherein the polymer comprises at least one non-conjugated spacer on main-chain. Very preferred non-conjugated or partially-conjugated polymers comprise a non-conjugated backbone unit or a unit interrupting the conjugation of backbone units. Like side-chain non-conjugated polymers, main-chain non-conjugated polymers give a high triplet level, which is preferred for triplet emitter.

Preferred non-conjugated backbone units are selected from units comprising indenofluorene derivatives, as shown, for example, in the following Formulae (163) and (164) and as disclosed in DE 102009023156.0.

Formula (163)

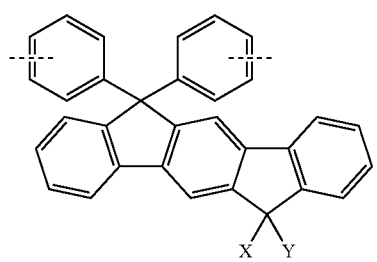

Formula (164)

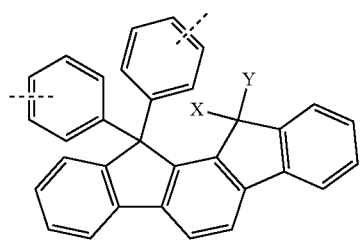

wherein X and Y are independently from each other selected from H, F, an alkyl group with 1 to 40 C-atoms, an alkylene group having 2 to 40 C-atoms, an alkinyl group having 2 to 40 C-Atoms, an substituted or unsubstituted aryl group having 6 to 40 C-atoms, and a substituted or unsubstituted heteroaryl group having 5 to 25 atoms.

Further preferred non-conjugated backbone units are selected from a unit comprising fluorene, phenanthrene, dehydrophenanthrene, indenofluorene derivatives, as shown, for example, in the following Formulae (165) to (178) and as disclosed in DE 102009023154.4.

Formula (165)

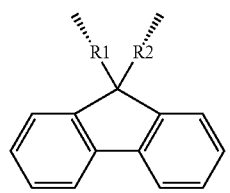

(Formula (166)

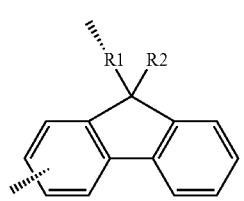

Formula (167)

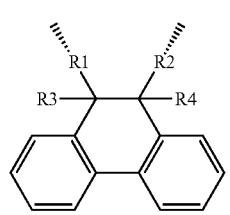

Formula (168)

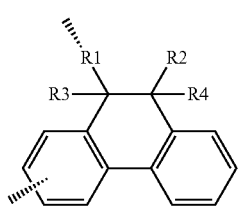

Formula (169)

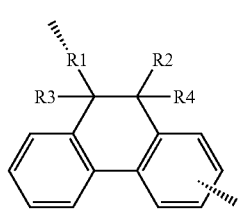

Formula (170)

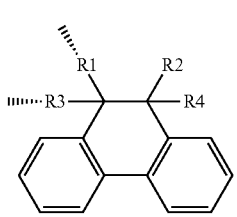

Formula (171)

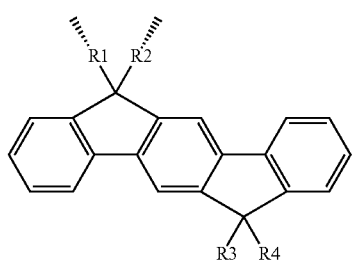

Formula (172)

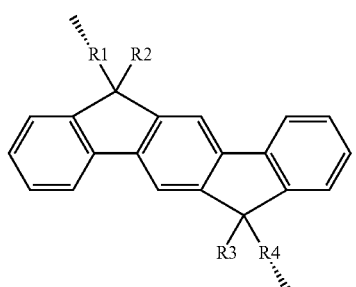

Formula (173)

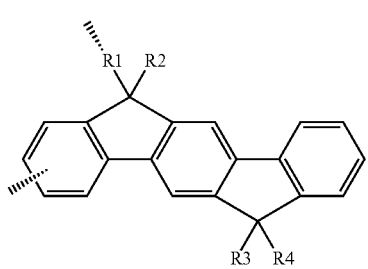

-continued

Formula (174)
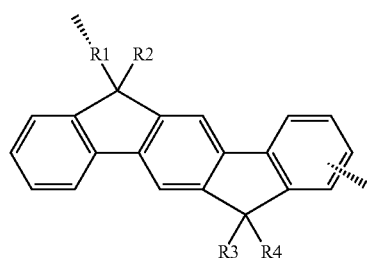

Formula (175)
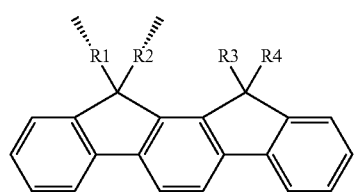

Formula (176)
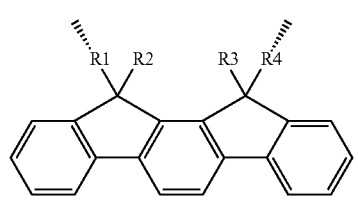

Formula (177)
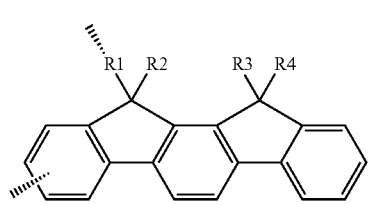

Formula (178)
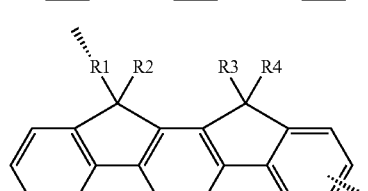

wherein $R^1$ to $R^4$ have the same meaning as X and Y, as defined above. In another preferred embodiment, the said copolymer is a side-chain non-conjugated polymer, which is especially important for phosphorescent emission based on polymer. In general, such phosphorescent polymer is obtained by means of radical copolymerization of vinyl compounds, and comprises at least one phosphorescent emitter and at least one charge transport unit on side chain, as disclosed in U.S. Pat. No. 7,250,226 B2. Further examples for such phosphorescent polymer are disclosed for example in JP 2007/211243 A2, JP 2007/197574 A2, U.S. Pat. No. 7,250,226B2, JP 2007/059939A.

In a further embodiment, the said copolymer can also be a non-conjugated polymer for fluorescent emission. Preferred singlet non-conjugated polymers are, for example, side-chain polymers with antracenenes, benzanthrecenes and their derivates in the side-chain, as disclosed in JP 2005/108556, JP 2005/285661, JP 2003/338375 etc.

In a further preferred embodiment, the copolymer as described above further comprises at least one cross-linkable group, enabling a multilayer formation. Cross-linking group is a group comprising a cross-linking reagent, which leads to a cross-linking reaction with the help of heating, or radiation or both. The radiation source can be selected from electron beam and UV light. The preferred UV light is selected from wavelength from 200-400 nm. For organic electronic device, UVA or a radiation from 300-400 nm is particularly preferred. The suitable UV source are for example mercury Ultraviolet fluorescent lamps, Ultraviolet LEDs, UV laser diodes and UV solid-state lasers Suitable cross-linkable groups are for example, acrylate group as disclosed for example by Scheler et al., in Macromol. Symp. 254, 203-209 (2007), vinyl group or styrene group as disclosed for example in WO 2006/043087 A1, and oxetane group as disclosed by Mueller et al., in Nature 421, 829-833 (2003), and azide group as disclosed for example in WO 2004/100282 A2

The present invention further related to a formulation comprising a copolymer as described above In a preferred embodiment, the said formulation is a solution comprising at least one organic solvent.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the copolymer in the solution is preferably 0.1 to 10 wt %, more preferably 0.5 to 5 wt %. Optionally, the solution also comprises one or more binders to adjust the rheological properties, as described in WO 2005/055248 A1.

Another preferred form of a formulation is an (mini-)emulsion or dispersion. A mini-emulsion is a specially formulated heterophase system in which stable nanodroplets of one phase are dispersed in a second, continuous phase. A dispersion can be obtained by removing the solvent in the nanodroplets.

Both mini-emulsion, wherein the continuous phase is a polar phase, and inverse mini-emulsion, wherein the continuous phase is a non-polar phase, are covered by the present invention. To increase the kinetic stability of the emulsion at least one surfactant can be added. The selection of solvents, surfactants, and the process of making a stable mini-emulsion is obvious for person skilled in the art and is published, e.g., by Landfester in Annu. Rev. Mater. Res. (06), 36, pp 231-279.

The invention further relates to a method for the preparation of a film using the formulation as described above.

Moreover, the invention concerns the use of the copolymer according to the invention for the production of electronic devices device After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve the copolymer of the present invention, although it is desirable to have at least one true solvent in a blend.

For use as thin layers in electronic devices the copolymer of the present invention may be deposited by any suitable method. Liquid coating is more desirable than other techniques. Solution deposition methods are especially preferred. Preferred deposition techniques include, without limitation, dip coating, spin coating, ink jet printing, letter-press printing, screen printing, doctor blade coating, roller printing, reverse-roller printing, offset printing, flexographic printing, Gravure printing, web printing, spray coating, brush coating or pad printing. Screen printing, ink-jet printing, flexo printing, Gravure printing, spray coating and offset printing is particularly preferred in the embodiments.

The said formulation described above should meet different requirements, depending on the printing method used. For example, in order to be applied by ink jet printing, the copolymer should be first dissolved in a suitable solvent, or prepared in a suitable emulsion or dispersion. Solvents must fulfill the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a copolymer of the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point higher than 100° C., more preferably higher than 140° C. Such solvent(s) also enhance film formation in the layer deposited and reduce defects in the layer.

The ink jet fluid (that is mixture of solvent, binder and the copolymer) preferably has a viscosity at 20° C. of 1 to 100 mPa·s, more preferably 1 to 50 mPa·s and most preferably 1 to 30 mPa·s.

The polymers or formulation according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, or inhibitors.

The invention further relates to electronic device comprising the copolymer according to the invention. Particularly preferred devices are PLEDs.

The device assembly typically consists of a substrate (like e.g. a glass sheet or a plastic foil), a first electrode, an interlayer comprising a conductive, doped polymer, a semiconductor layer containing the copolymer according to the invention, and a second electrode. The device is patterned and provided with contacts according to the desired application and then sealed, in order to avoid contact with water and air which could drastically reduce its lifetime. It may also be preferred to use a conductive, electrically doped polymer as electrode, in which case the interlayer comprising the conductive polymer can be omitted. For use in OFETs and TFTs the device has to contain a further electrode (gate electrode) in addition to the first and second electrode (source and drain electrode). The gate electrode is separated from the organic semiconductor layer by an insulator layer comprising a dielectric material having a dielectric constant that is usually high (but in some cases may also be low). It may also be suitable that the device comprises one or more further layers depending on the desired application.

The electrodes are selected such that their potential matches the potential of the adjacent organic layer, to ensure that hole or electrode injection is as efficient as possible. Preferred cathode materials are metals with low electronic work function, metal alloys or multilayered structures comprising different metals, such as alkaline earth metals, alkaline metals, main group metals or lanthanoides (e.g. Ca, Ba, Mg, Al, In, Mg, Yb, etc.). In case of multilayered structures it is also possible to use further metals in addition to the abovementioned metals, which have a relatively high electronic work function, like e.g. Ag. In such cases normally combinations of metals are used, like e.g. Ca/Ag or Ba/Ag. It may also be preferred to apply a thin intermediate layer of a material with a high dielectric constant between the metallic cathode and the organic semiconductor. Useful materials for this purpose are e.g. alkaline or alkaline earth metal fluorides or oxides (e.g. LiF, $U_2O$, $BaF_2$, $MgO_1$ NaF etc.). The thickness of this dielectric layer is preferably from 1 to 10 nm.

Preferred anode materials are those having a high electronic work function.

Preferably the anode has a potential of more than 4.5 eV (vs. vacuum). Suitable materials for this purpose are metals having a high redox potential, like e.g. Ag, Pt or Au. It may also be preferred to use metal/metaloxide electrodes (e.g. Al/Ni/$NiO_x$, Al/Pt/$PtO_x$). For some applications at least one of the electrodes has to be transparent, in order to enable e.g. irradiation of the organic material (in OSCs) or decoupling of light (in OLEDs/PLEDs, O-LASERs). A preferred assembly comprises a transparent anode. Preferred anode materials for this purpose are conductive mixed metal oxides. Especially preferred are Indium Tin Oxide (ITO) or Indium Zinc Oxide (IZO). Further preferred are also conductive, doped organic materials, especially conductive doped polymers.

As charge injection layer on the anode a variety of doped conductive polymers can be used. Preferred polymers are those having a conductivity of higher than $10^{-8}$ S/cm. The potential of the layer is preferably 4 to 6 eV (vs. vacuum). The layer thickness is preferably from 10 to 500 nm, very preferably from 20 to 250 nm. Very preferably derivatives of polythiophene, like poly(3,4-ethylenedioxy-2,5-thiophene) (PEDOT) and polyaniline (PANI) are used. Doping is usually carried out with acids or oxidative agents. Preferably doping is carried out with polymeric or polymer bound Brönsted acids. Preferred materials for this purpose are polymeric sulfonic acids, especially polystyrene sulfonic acid, polyvinyl sulfonic acid and poly-(2-acrylamido-2-methyl-propane sulfonic acid) (PAMPSA). The conductive polymer is usually applied as an aqueous solution or dispersion and is insoluble in organic solvents, which allows to apply the subsequent layer from organic solution.

Typically, the copolymer according to the invention is coated on a device structure which consists of ITO-coated glass which was covered by a layer of conductive polymer.

The thickness of the conductive polymer can vary between 10 and 200 nm depending on ITO-roughness. The copolymer according to the invention is then coated from solution onto the conductive polymer in a thickness varying from 20 to 120 nm, preferably from 60 to 100 nm. Typically, the conductive polymer and the copolymer is baked after coating to remove rest of solvents (water and organic solvent) for a certain period of time. Baking temperatures vary from the polymers used and are typically in the range of 100 to 200° C. for 1 to 120 minutes, preferably 130 to 200° C. for 1 to 60 minutes and most preferably 150 to 180° C. for 10 to 30 minutes.

After coating the cathode on top of the copolymer according to the invention, the device is typically covered by a lid to avoid penetration of moisture and oxygen.

In another embodiment of this invention the copolymer can also be coated onto an interlayer. In this case a polymer having hole transport property is coated from organic solution onto the conductive polymer and the film is heated at elevated temperature to form an interlayer. Then, non-solidified residues of the interlayer are washed away with the organic solvent and the copolymer is coated directly onto the deposited interlayer. Alternatively, the copolymer can also be directly coating onto the interlayer. After coating the copolymer, a heating procedure as described above is applied again.

Preferably, the electronic device comprises a conductive polymer layer and/or a hole transporting layer, wherein the copolymer according to the invention is coated directly onto said conductive polymer and/or hole transport layer.

In a preferred embodiment, the electronic device is a polymer light emitting diode (PLED), organic light emitting electrochemical cells, organic field effect transistor (OFET), thin film transistor (TFT), organic solar cell (O-SC), dye-sensitised solar cell, organic laser diode (O-laser), organic integrated circuit (O-IC), radio frequency identification (RFID) tag, photodetector, sensor, logic circuit, memory element, capacitor, charge injection layer, Schottky diode, planarising layer, antistatic film, conducting substrate or pattern, photoconductor, electrophotographic element, or organic light emitting transistor (OLET), organic spintronic device, organic plasmon emitting device (OPED). The preferred electronic device is OLED.

In a preferred embodiment, the electronic device comprises an anode, a cathode, a semiconductor or emissive layer comprising a copolymer as described herein, and an interlayer comprising a material having hole transporting and electron blocking property provided between the anode and the semiconductor or emissive layer. A device with such an interlayer is generally described in WO 2004/084260 A2.

Preferably, the electronic device comprises a copolymer as described herein, and further comprises a conductive polymer layer and/or a hole transporting layer, wherein the copolymer is coated directly onto said conductive polymer and/or hole transporting layer. More preferred the electronic device comprises, in the sequence as described in the following optionally a first substrate,
an anode layer,
optionally a hole injection layer,
optionally an interlayer comprising a material having electron blocking property,
a layer comprising the copolymer according to the invention,
a cathode layer,
optionally a second substrate.

In another preferred embodiment, the electronic device of the invention is polymer based OLEDs, which comprises the multilayer structure as follows: anode/HIL/EML/cathode.

The HIL (hole injection layer) is usually a transparent conductive polymer thin film comprising HIM. Preferred HIM are those mentioned above.

Further, preferred PLEDs comprises an interlayer between LEP and HIL, as disclosed in WO 2004/084260 A2, wherein the interlayer has a hole transport and electron blocking functions. The interlayer comprises preferably a polymer, which is a copolymer of the backbone unit and a hole transport unit as described above.

The devices of the present invention may employ copolymer comprising two emitter units that in a single emissive region sufficiently cover the visible spectrum. White emission is achieved from two emitters in a single emissive region through the formation of an aggregate by one of the emissive centers. This allows the construction of simple, bright and efficient OLEDs for white light that exhibit a high color rendering index.

Both full color display devices and tunable lighting devices are possible within the scope of the invention. A full color display device generally employs three emitters, each emitting light of a different color such as red, green and blue light. A tunable lighting device generally uses two emitters, each emitting light of a different color. The device may be operated by providing current to each of the subpixels within a pixel. A change in the ratio of currents to the subpixels will affect both the color and the brightness of the light emitted from the pixel.

The device structure of the above mentioned electronic device should be clear for the expert in the field. Nevertheless, for the sake of clarity, reference is made to some detailed device structures.

Organic Plasmon emitting device is preferably referred to the device as reported by Koller et al., in Nature Photonics (08), 2, pp 684-687. The OPED is very similar as OLED as described above, except that at least one of anode and cathode should be capable to couple surface Plasmon from the emissive layer. It is preferred that an OPED comprises one nano-diamondoid or the mixture as described above and below.

Electrophotographic element comprises a substrate, an electrode, and a charge transport layer above the electrode, optionally a charge generation layer between electrode and the charge transport layer. For device details and variations and the materials used therein please it is referred to "Organic Photoreceptors for Xerography" Marcell Dekker, Inc., Ed. by Paul M. Borsenberger & D. S. Weiss (1998). It is preferred that such device comprises one nano-diamondoid or the mixture as described above and below, especially in charge transport layer.

One preferred organic spintronic device is a spin-valve device, as reported by Z. H. Xiong et al., in Nature 2004, Vol. 427 pp 821, comprising two ferromagnetic electrodes and an organic layer between the two ferromagnetic electrodes, wherein at least one of the organic layers comprising a compound according the present invention and the ferromagnetic electrode is composed of Co, Ni, Fe, or alloys thereof, or $ReMnO_3$ or $CrO_2$, wherein Re is rare earth element.

Organic light emitting electrochemical cells (OLECs) comprises two electrodes, and a mixture or blends of electrolyte and fluorescent species in between, as firstly reported by Pei & Heeger in Science (95), 269, pp 1086-1088. It is desired that nano-diamondoid or the mixture as described above and below could be used in such device.

Dye-sensitized solar cells (DSSCs) comprises, in the sequence, an electrode/dye-sensitized $TiO_2$ porous thim film/electrolyte/counter electrode, as firstly reported by O'Regan & Gratzel in Nature (91), 353, pp 737-740. The liquid electrolyte can be replaced by a solid hole transport layer, as reported in Nature (98), 395, pp 583-585.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The teaching as disclosed here can be abstracted und combined with other examples disclosed.

Other features of the invention will become apparent in the course of the following description of exemplary embodiments and drawings, which are given for illustration of the invention and are not intended to be limiting thereof.

BRIEF DESCRIPTION OF THE DRAWINGS

FIG. 1: I-V (current-voltage) diagram as measured with cyclic voltammetry (CV) for polymer IL1.

Figure 2:
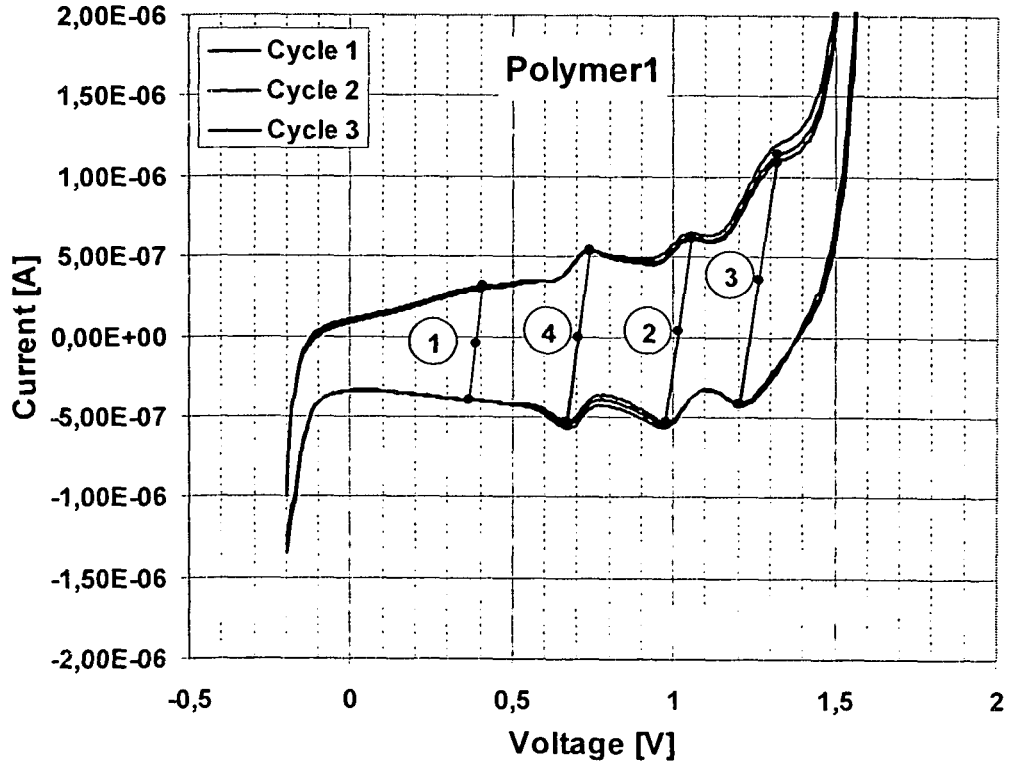
FIG. 2: I-V diagram as measured with CV for copolymer 1.

FIG. 2: I-V diagram as measured with CV for copolymer 1.

Figure 3:
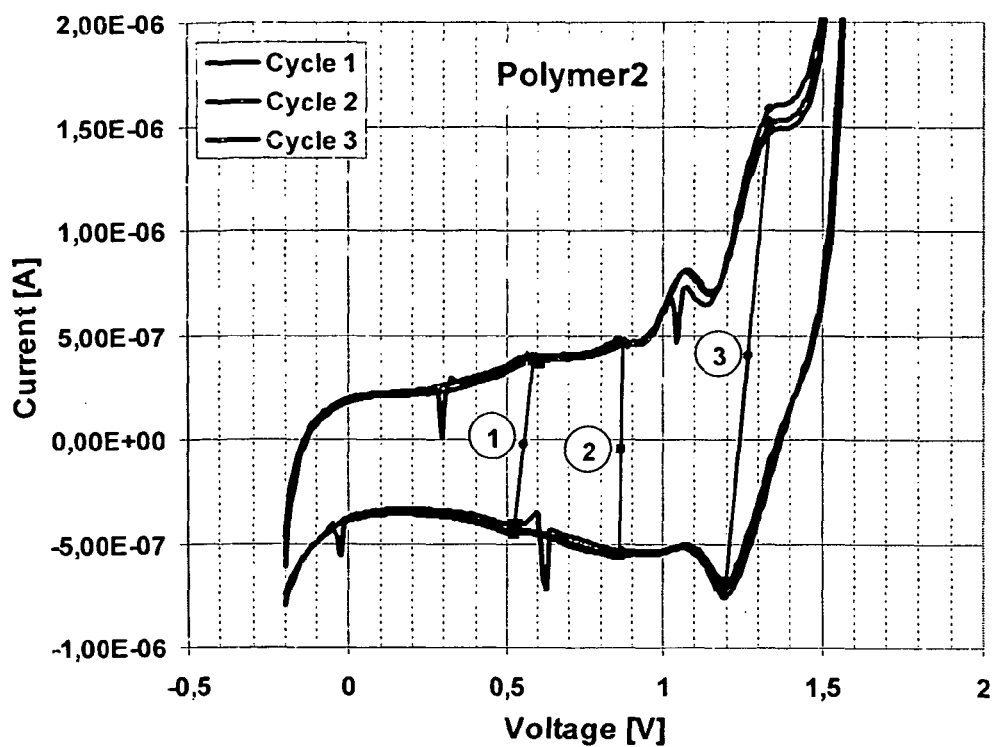
FIG. 3: I-V diagram as measured with CV for copolymer 2.

FIG. 3: I-V diagram as measured with CV for copolymer 2.

Figure 4:
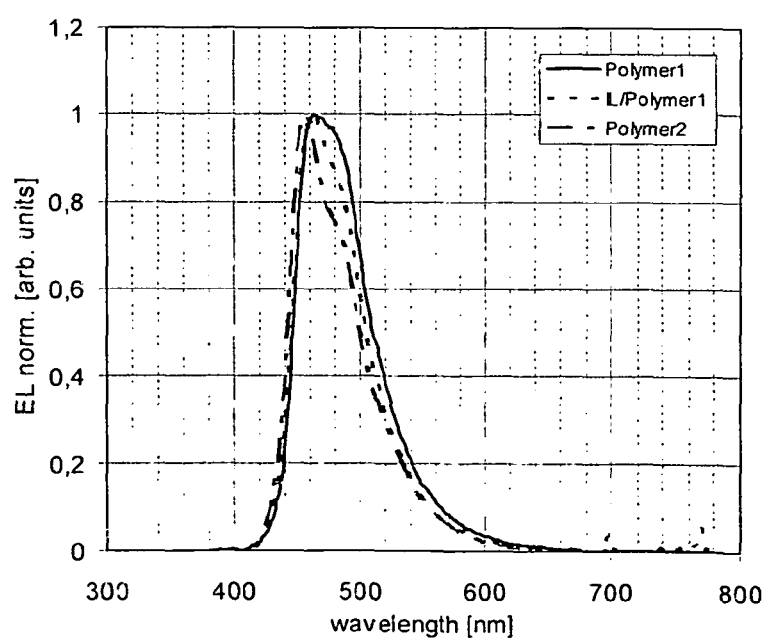
FIG. 4: EL spectrum of polymer IL1, copolymer 1 and copolymer 2.

FIG. 4: EL spectrum of polymer IL1, copolymer 1 and copolymer 2.

Figure 5:
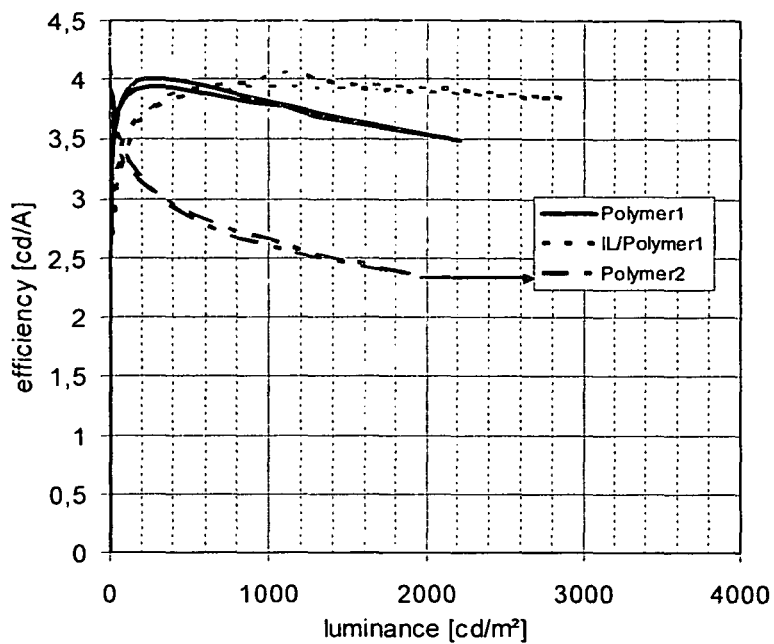
FIG. 5: Efficiency versus luminance for polymer IL1, copolymer 1 and copolymer 2.

FIG. 5: Efficiency versus luminance for polymer IL1, copolymer 1 and copolymer 2.

Figure 6:
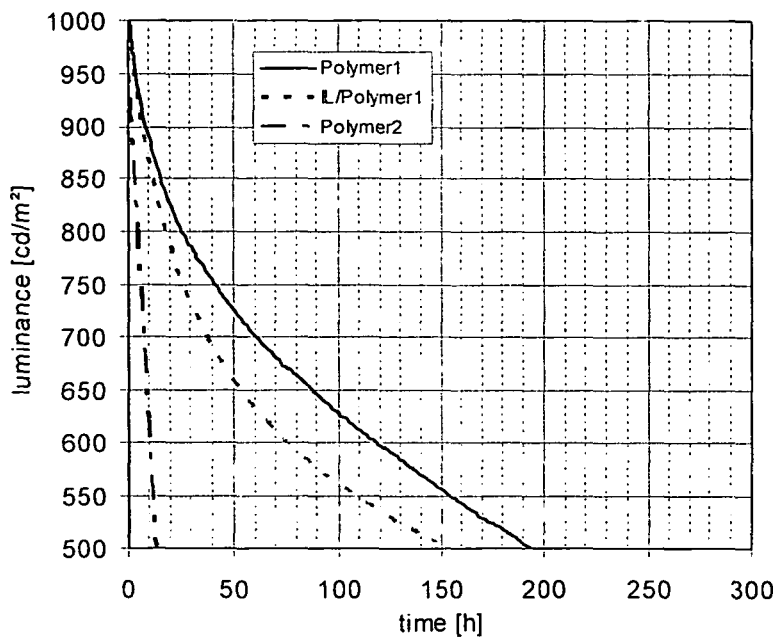
FIG. 6: Lifetimes of polymer IL1, copolymer 1 and copolymer 2.
Figure 7:
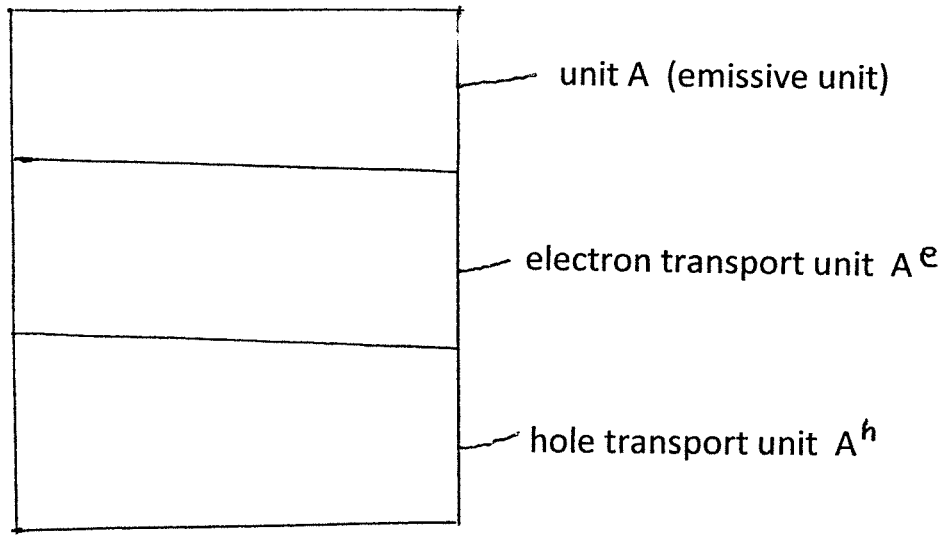
FIG. 7 schematically illustrates the various units of this invention.

FIG. 6: Lifetimes of polymer IL1, copolymer 1 and copolymer 2.

WORKING EXAMPLES

Example 1

Materials

The following copolymer 1, which is a polymer according to the present invention, and copolymer 2, which is a comparative polymer, are synthesized using the monomers M1 to M5. The amounts in mol % of monomers used are given in Table 1. Polymer IL1 is synthesized using the monomers M6 and M7 in the ratio 1:1.

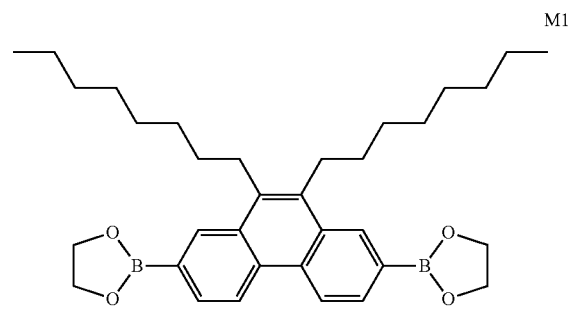

M1

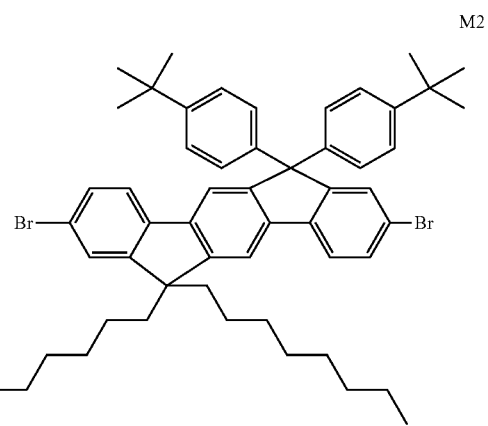

M2

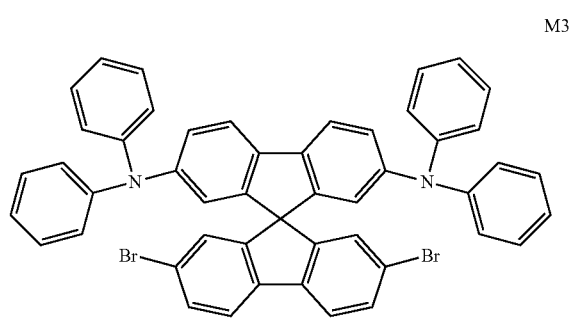

M3

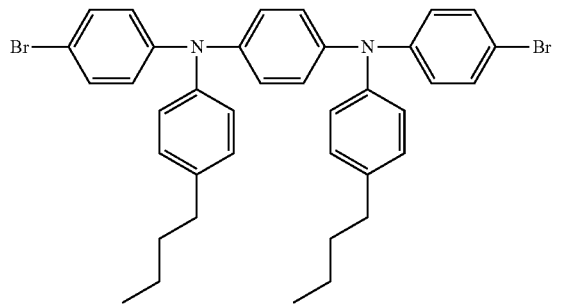

M4

-continued

M5
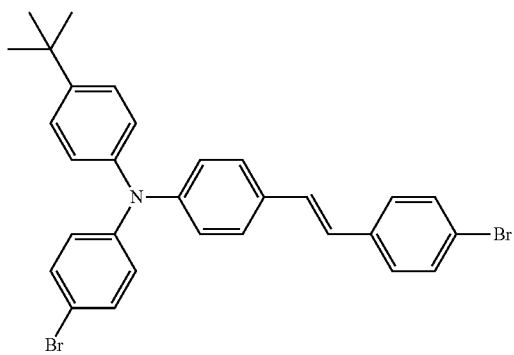

M6
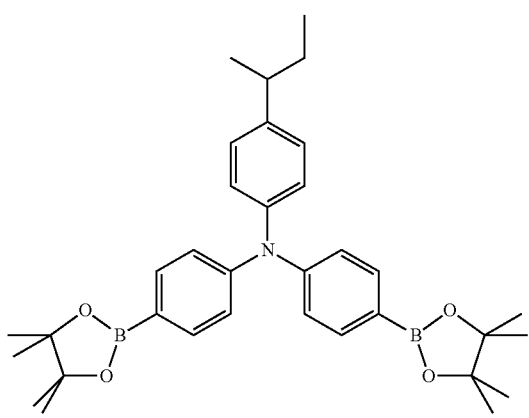

M7
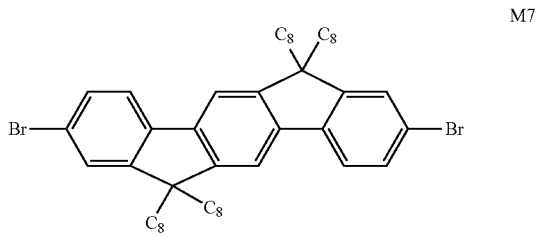

M8
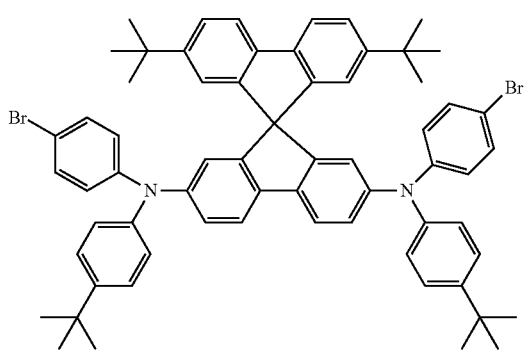

TABLE 1

|  | M1 | M2 | M3 | M4 | M5 | M6 | M7 | M8 |
|---|---|---|---|---|---|---|---|---|
| copolymer 1 | 50 | 31 | 15 | 2 | 2 | 0 | 0 | |
| copolymer 2 | 50 | 46 | 0 | 2 | 2 | 0 | 0 | |
| copolymer 3 | 50 | 31 | 0 | 2 | 2 | 0 | 0 | 15 |
| copolymer 4 | 42 | 46.4 | 0 | 1.6 | 2 | 8 | 0 | 0 |

TABLE 1-continued

|  | M1 | M2 | M3 | M4 | M5 | M6 | M7 | M8 |
|---|---|---|---|---|---|---|---|---|
| copolymer 5 | 40 | 46.4 | 0 | 1.6 | 2 | 10 | 0 | 0 |
| copolymer 6 | 38 | 46.4 | 0 | 1.6 | 2 | 12 | 0 | 0 |
| IL1 | 0 | 0 | 0 | 0 | 0 | 50 | 50 | |

Copolymer 1 to 6 are used as emissive layer. Copolymer 1 is an emissive polymer according to the present invention, with the suitable hole transport unit on side-chain. Copolymer2 is an emissive polymer according to the prior art for OLED with interlayer. Copolymer3 is an emissive polymer with the similar hole transport unit as copolymer1, but directly on polymer backbone, and will be compared with copolymer1. The polymer IL1 with 50% M6 and 50% M7 is used as interlayer in the device testing.

Example 2

Cyclic Voltammetry Measurement

The HOMO levels of the above polymers are measured by cyclovoltammetry (CV). The CV measurements are conducted in dichlormethane solution using tetrabutylammonium chloride as conducting salt, Ag/AgCl/KCl (3 mol/l) as reference electrode, Au as working electrode and Pt as counter electrode. FIG. 1, FIG. 2 and FIG. 3 are the CV curves for polymer IL1, copolymer 1 and copolymer 2, respectively. Three cycles are measured for every polymer. The HOMO levels are calculated by the average voltage of the local maximum peak in oxidation-curve and corresponding local minimum peak reduction-curve. Care should be taken to find the correct local minima and maxima, for example change the axis case to find all peaks. The results are summarised in Table 2, with the alignments of the different function groups to the corresponding peaks.

Except peak 1 in copolymer 1 and peaks 1 and 2 in copolymer 2, all peaks can be quite well defined. All three cycles give essentially the same results, indicating very reliable HOMO levels can be obtained by CV measurement.

Example 3

Quantum Chemistry Simulations

In order to design a polymer according to the present invention, the forecast of the HOMO levels of different components are essential.

The quantum simulations on organic functional materials are conducted in Gaussian 03W (Gaussian Inc.). For organic compound comprising no metal, at first AM1 is used to optimise the molecular geometry, and TD-DFT (time-dependent density functional theory) with correction functional B3PW91 and basis set 6-31G(d) is used for energy calculations. The important results include HOMO/LUMO levels and energies for triplet and singlet excited states. The HOMO and LUMO are corrected by cyclic voltammetry (CV) as follows: a set of materials are measured by CV and also calculated by the methods mentioned above. The calculated values are then calibrated according to the measured values. Such calibration factor is used for further calculation. From the energy calculation one gets HOMO HEh and LUMO HEh in Hartree units. And the HOMO and LUMO values in electron volts is determined with following equations, which are resulted from the calibration using CV measurements.

$HOMO(eV) = ((HEh*27.212) - 0.9899)/1.1206$ $LUMO(eV) = ((LEh*27.212) - 2.0041)/1.385$

These values will be used as HOMO-LUMO levels of the compounds in the present invention. As an example, we obtain for the trimer M1-M2-M1 (see also Table 1) from the calculation of a HOMO of −0.19235 Hartree and a LUMO of −0.05773 Hartree, which correspond a calibrated HOMO of −5.55 eV, and a calibrated LUMO of a calibrated −2.58 eV.

For polymers, especially conjugated polymers, the trimers of the polymer were calculated. For example, for a polymer polymerized by monomer M1 and M2 as shown bellow, the trimers M1-M2-M1 and/or M2-M1-M2 are used in calculation, wherein the polymisable groups are removed and the long alkyl chains are reduced to methyl chain. The agreement between measurements and simulations on polymers can be referred to WO 2008/011953 A1 and be also seen in the following with the comparison of CV measurements and DFT calculations.

TABLE 2

Comparison of CV measurement and DFT calculation

| Calculated trimer by DFT | Corresponding unit in the (co)polymer | HOMO Calibrated [eV] | HOMO measured by CV [eV] |
|---|---|---|---|
| M7-M6-M7 | Hole transport unit in IL1 | −5.14 | −5.14 |

TABLE 2-continued

Comparison of CV measurement and DFT calculation

| Calculated trimer by DFT | Corresponding unit in the (co)polymer | HOMO Calibrated [eV] | HOMO measured by CV [eV] |
|---|---|---|---|
| M1-M2-M1 | Electron transport units in copolymer 1 | −5.55 | −5.58 |
| M1-M4-M1 | Unit A in copolymer 1 | −4.89 | −4.81 |
| M1-M5-M1 | Emissive units in copolymer 1 | −5.17 | −5.24 |
| M1-M3-M1 | Hole transport units in copolymer 1 | −4.99 | −5.02 |
| M1-M2-M1 | Electron transport units in copolymer 2 | −5.55 | −5.58 |
| M1-M4-M1 | Unit A in copolymer 2 | −4.89 | −4.87 |
| M1-M5-M1 | Emissive units in copolymer 2 | −5.17 | −5.18 |

As can be seen in Table 2, the correlation between calculation on HOMO levels and experimental measurements using CV is very high ($R^2 = 0.9836$; $R = 0.9918$). Therefore, the

M1-M2-M1

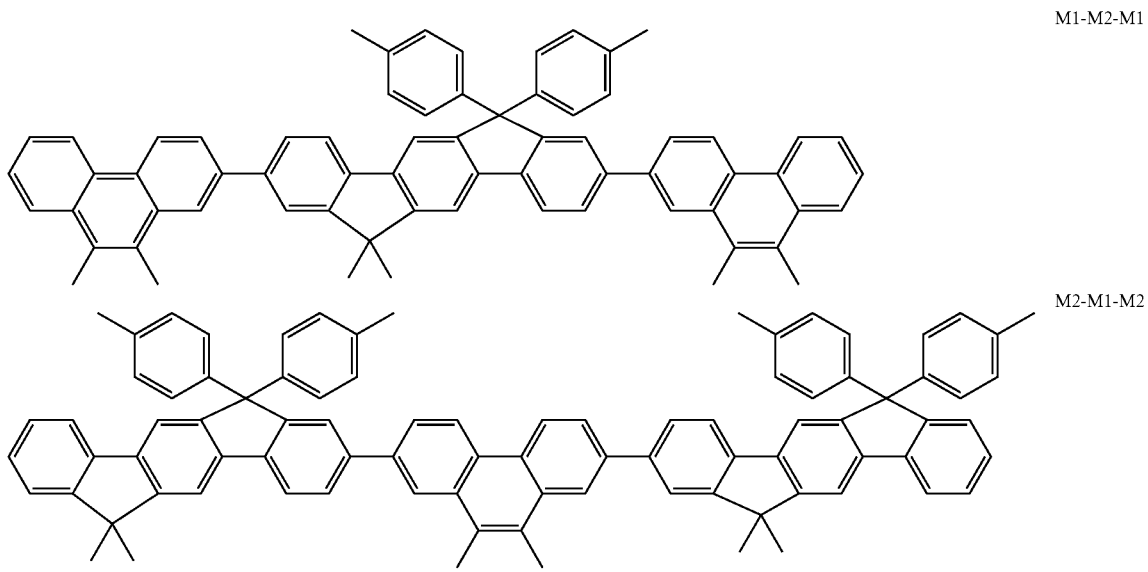

M2-M1-M2

For the calculation, the trimer M7-M6-M7 is taken as hole transport unit in polymer IL1; M1-M4-M1 as unit A and M1-M5-M1 as emissive unit, and M1-M2-M1 as electron transport unit in copolymer 1 and copolymer 2. Additionally, trimer of M1-M3-M1 is added as hole transport unit in copolymer 1.

The CV measured and DFT calculated energy levels for the different function units in the (co)polymers are shown in Table 2.

established simulation method can be used as a reliable tool for designing the material system according to the present invention.

Example 4

OLED Device Preparation

OLED devices with polymer IL1 as interlayer are prepared according to the following steps
1. Deposition of 80 nm PEDOT (Baytron P AI 4083) onto indium tin oxide coated glass substrate by spin coating.
2. Deposition of 20 nm polymer IL1 by spin coating from toluene solution having a concentration of 0.5 wt %/l.
3. Heating the device at 180° C. for 1 h.
4. Deposition of the emissive polymer by spin-coating from toluene solution to a thickness of 65 nm. Polymer1 is used as emissive polymer.

5. Heating the device at 180° C. for 10 min.
6. Deposition of the cathode (3 nmBa/150 nmAl) by vacuum evaporation over the emissive layer
7. Encapsulation of the device.

The resulted OLED with interlayer has the following layer structure: Cathode (Ba/Al 3 nm/150 nm)/EML (Emissive Polymer; 65 nm)/IL (IL1; 20 nm)/Buffer (PEDOT; 80 nm)/Anode (ITO).

As the preferred device structure, OLEDs without interlayer are prepared by the procedure as the OLED with interlayer, but omitting the steps 2 and 3. The corresponding layer structure is as follows: Cathode (Ba/Al 3 nm/150 nm)/EML (Emissive Polymer; 65 nm)/Buffer (PEDOT; 80 nm)/Anode (ITO).

Example 5

Device Performance

The following devices are prepared and characterized:
(a) OLED without interlayer using copolymer 1 as emissive layer,
(b) OLED with interlayer using copolymer 1 as emissive layer, and
(c) OLED without interlayer using copolymer 2 as emissive layer.
(d) OLED without interlayer using copolymer 3 as emissive layer.

Unless stated otherwise, all specific values of physical parameters like efficiency, VIL curves and lifetime, as given above and below refer to a temperature of 25° C. (±1° C.).

The performance of these four OLEDs is summarized in the following Table 3.

TABLE 3

| EML | Max Eff. [cd/A] | U on [V] | U (100) [V] | CIE at 100 cd/m$^2$ | EQE at max. Eff. | LT DC [hrs at nits] | |
|---|---|---|---|---|---|---|---|
| (a) No IL/ copolymer 1 | 3.82 | 3.5 | 6.3 | 0.15/0.22 | 2.40% | 192 | 1005 |
| (b) IL/ copolymer 1 | 4.07 | 3.2 | 5.2 | 0.15/0.20 | 2.83% | 152 | 1005 |
| (c) No IL/ copolymer 2 | 4.15 | 3.7 | 6.5 | 0.15/0.18 | 2.96% | 13 | 999 |
| (d) No IL/ copolymer 3 | 4.37 | 3.3 | 5.8 | 0.15/0.21 | 2.76% | 30 | 1000 |

In comparison with copolymer 1 and copolymer 2 in devices (a) and (c), respectively, without interlayer (IL), copolymer 1 gives much better lifetime than copolymer 2, indicating that integrating the side-chain hole transporting unit according to the present invention is an effective way to significantly increase lifetime.

In comparison with copolymer 1 in different devices: with (b) and without (a) interlayer (single layer), it is found that the single layer device gives a comparable performance as in interlayer device, but with more than 25% improvement in lifetime, indication that for copolymer 1 the interlayer is not necessary, which is a big advantage for mass-production.

In comparison with copolymer 1 and copolymer 3 in devices (b) and (d), respectively, without interlayer (IL1), copolymer 1 shows much better lifetime than copolymer 3, showing that integrating the side-chain hole transporting unit according to the present invention is superior to integrating hole transport unit in polymer main-chain.

The EL spectral, efficiency versus luminance and lifetime behaviours are shown in FIG. 4 to FIG. 6. The difference in EL spectral is due to the different cavity effect in the device with different polymers and different device structures. The difference in efficiency versus luminance is attributed to the different charge balance in the devices.

Another way to get emissive polymers, which can be used in OLEDs without interlayer is to directly integrate the same polymer segment as IL1 into the emissive polymer. Blockcopolymers, copolymer 4 to 6 are synthesized according to same method as disclosed in DE 10337077A1. Generally, the synthesis for the block-copolymer follows in two steps. At first, the first block can be synthesized. For copolymer 4 to 6, the first block is the hole transporting block by coupling M2 and M6 with the corresponding mol % listed in Table 4. Then the other monomers can be added to finish the polymerisation, as shown in the following for copolymer 4:

TABLE 4

|  | M2 | M6 |
|---|---|---|
| copolymer 4 | 9 | 8 |
| copolymer 5 | 11 | 10 |
| copolymer 6 | 13 | 12 |

The OLEDs using copolymer 4 to 6, with and without IL1 as interlayer are prepared and characterised as described above. The results are compared in Table 5. As can be clearly seen, the copolymers 4 to 6, which have hole transporting unit on the main-chain, works better in device with interlayer than without, both regarding efficiency and lifetime.

TABLE 5

| EML | Max Eff. [cd/A] | U on [V] | U (100) [V] | CIE at 100 cd/m$^2$ | LT DC [hrs at nits] | |
|---|---|---|---|---|---|---|
| IL/Copolymer4 | 4.32 | 3.18 | 4.96 | 0.14/0.17 | 159 | 1000 |
| No IL/Copolymer4 | 3.86 | 3.23 | 5.29 | 0.15/0.13 | 66 | 1000 |
| IL/Copolymer5 | 3.81 | 3.16 | 4.97 | 0.14/0.17 | 203 | 1000 |
| No IL/Copolymer5 | 3.59 | 3.21 | 5.19 | 0.15/0.13 | 137 | 1000 |
| IL/Copolymer6 | 3.21 | 3.11 | 4.86 | 0.14/0.16 | 94 | 1000 |
| No IL/Copolymer6 | 2.85 | 3.10 | 4.86 | 0.15/0.13 | 73 | 1000 |

The invention claimed is:

1. An electroluminescent copolymer comprising:
   (a) at least one hole transport unit $A^h$ on one or more side-chain(s) of the copolymer;
   (b) at least one electron transport unit $A^e$;
   (c) at least one unit A;
   (d) optionally at least one emitter unit
   wherein the HOMOs of both hole transport unit(s) and unit(s) A are at least 0.3 eV higher than the HOMO of the electron transport unit(s).

2. The copolymer according to claim 1, wherein the copolymer is copolymer with a conjugated backbone and the HOMO of the hole transport unit(s) is higher than 0.3 eV and the HOMO of the unit(s) A is higher than 0.4 eV than the HOMO of the electron transport unit(s).

3. The copolymer according to claim 1, wherein the HOMO of the hole transport unit is lower than that of unit A.

4. The copolymer according to claim 1, wherein the LUMO of unit A is higher than the LUMO of said electron transport unit.

5. The copolymer according to claim 1, wherein unit A is itself an emissive unit.

6. The copolymer according to claim 1, wherein the ratio of said unit A is in the range from 0.01 to 10 mol % with respect to the copolymer.

7. The copolymer according to claim 1, wherein the ratio of said hole transport group $A^h$ is in the range from 5 to 30 mol % with respect to the copolymer.

8. The copolymer according to claim 1, wherein the molar amount of said electron transport group $A^e$ is in the range from 10 to 95 mol % with respect to the copolymer.

9. The copolymer according to claim 1, wherein the molar amount of said electron transport group $A^e$ is in the range from 50 to 90 mol % with respect to the copolymer.

10. The copolymer according to claim 1, wherein the copolymer comprises at least one additional emitter unit $A^{em}$, which has a smaller band gap than unit A.

11. The copolymer according to claim 10, wherein said additional emissive unit has a higher HOMO than said unit A.

12. The copolymer according to claim 10, wherein said at least one additional emissive unit $A^{em}$ emit blue, green and/or red light.

13. The copolymer according to claim 10, wherein the ratio of the said additional emissive unit $A^{em}$ is in the range from 0.01 to 10 mol % with respect to the copolymer.

14. The copolymer according to claim 1, wherein the said hole transport unit is bonded to the backbone of the copolymer by a non-conjugated spacer.

15. The copolymer according to claim 1, wherein the backbone of the copolymer comprises at least one of the said electron transport unit.

16. The copolymer according to claim 1, comprising one or more identical or different electron transport unit(s) selected from the group consisting of naphthyl, pyridine, anthracene, benzanthracene, binaphthylanthracene, phenanthroline, dihydrophenanthrene, fluorene, phosphine, indenofluorene, phenanthrene, phosphinoxide, furan, imidazole, triazine, pyrazine, keton and their derivatives and combinations thereof.

17. The copolymer according claim 1, comprising one or more identical or different hole transport unit(s) selected from the group consisting of amines, triarylamines, thiophenes, carbazoles, phthalocyanines, porphyrines and their derivatives.

18. A formulation comprising a copolymer according to claim 1, and at least one solvent.

19. An electronic device comprising a copolymer according to claim 1.

20. The electronic device according to claim 19, wherein the device is an organic light emitting diode, a polymer light emitting diode, an organic light emitting transistor, an organic light emitting electrochemical cell, an organic light emitting electrochemical transistor, an organic field effect transistor, a thin film transistor, an organic solar cell, an organic laser diode, an organic integrated circuit, a radio frequency identification tag, a photodetector, a sensor, a logic circuit, a memory element, a capacitor, a charge injection layer, a Schottky diode, a planarizing layer, an antistatic film, a conducting substrate or pattern, a photoconductor, an electrophotographic element, an organic solar concentrator, an organic spintronic devices, or an organic plasmon emitting device.

21. An electronic device which comprises a conductive polymer layer and/or a hole transporting layer, and wherein the copolymer according to claim 1 is coated directly onto said conductive polymer and/or hole transport layer.

* * * * *